United States Patent [19]
Weng et al.

[11] Patent Number: 5,822,336
[45] Date of Patent: Oct. 13, 1998

[54] MODIFIED REED SOLOMON CODE SELECTION AND ENCODING SYSTEM

[75] Inventors: Lih-Jyh Weng, Needham; Ba-Zhong Shen, Worcester, both of Mass.

[73] Assignee: Quantum Corporation, Milpitas, Calif.

[21] Appl. No.: 749,235

[22] Filed: Nov. 14, 1996

[51] Int. Cl.⁶ .......................... H03M 13/00; G11B 20/18
[52] U.S. Cl. ...................... 371/37.11; 371/40.14
[58] Field of Search ............... 371/37.11, 40.14

[56] References Cited

U.S. PATENT DOCUMENTS

| 4,856,003 | 8/1989 | Weng ............................... 371/37 |
| 5,428,630 | 6/1995 | Weng et al. ...................... 371/40.1 |

*Primary Examiner*—Stephen M. Baker
*Attorney, Agent, or Firm*—Patricia A. Sheehan; Debra A. Chun

[57] ABSTRACT

An error correction system includes an encoder that uses a modified Reed-Solomon code to encode m-bit data symbols over $GF(2^{m+i})$ and form a preliminary code with d−1 (m+i)-bit ECC symbols. The encoder then modifies the ECC symbols by combining the preliminary code word with a combination of one or more modifying code words to produce modified ECC symbols that have i bits set in a pre-selected pattern. This combination also results in "R" pseudo redundancy symbols that include the i-bit pattern being appended to the modified ECC symbols. The encoder truncates the i-bit pattern from each of the ECC symbols and the pseudo-redundancy symbols, to produce a data code word that has symbols that are elements of $GF(2^m)$. To decode the data code word, the decoder fills in the i-bit pattern in each of the data code word symbols and decodes the code word, treating the first R of the modified ECC symbols as code word data, or information, symbols, and the remaining modified ECC symbols and the pseudo redundancy symbols as code word ECC symbols. The system determines for the encoder the generator polynomial, g(x), and the modifying code words by determining a $g(x)=(x+\alpha^L)*(x+\alpha^{L+1})\ldots*(x+\alpha^{L+d-2})$ with $L=1, 2, \ldots$ that produces $i*(d-1)$ modifying code words that have only one selected bit of the i-bit pattern set to a one.

14 Claims, 9 Drawing Sheets

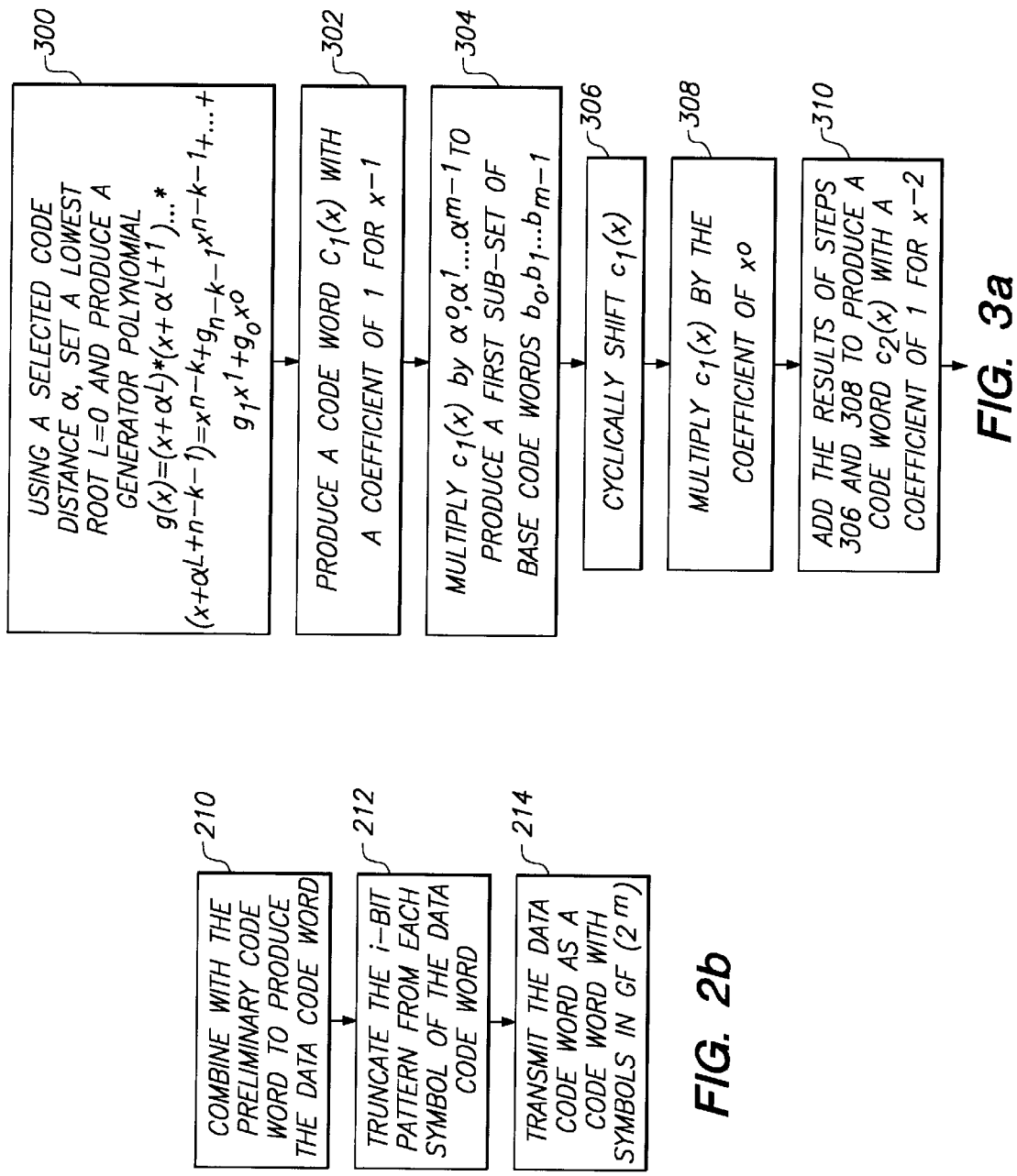

Modified Codes over GF($2^8$) from Reed-Solomon codes over GF($2^9$),
Primitive Polynomial for GF($2^9$) is p(x) = $x^9 + x^4 + 1$

| d= | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|
| R= | 1 | 1 | 1 | 1 | 1 | 1 | 1 | 1 | 2 | 2 | 2 | 2 | 2 | 2 | 2 | 2 |
| L= | 1 | 1 | 1 | 1 | 1 | 2 | 2 | 6 | 1 | 1 | 1 | 1 | 1 | 1 | 1 | 2 |

| d= | 18 | 19 | 20 | 21 | 22 | 23 | 24 | 25 | 26 | 27 | 28 | 29 | 30 | 31 | 32 | 33 |
|---|---|---|---|---|---|---|---|---|---|---|---|---|---|---|---|---|
| R= | 3 | 3 | 3 | 3 | 3 | 4 | 4 | 4 | 4 | 4 | 4 | 4 | 4 | 4 | 4 | 4 |
| L= | 1 | 1 | 1 | 2 | 1 | 1 | 3 | 1 | 1 | 1 | 1 | 1 | 1 | 3 | 2 | 2 |

| d= | 34 | 35 | 36 | 37 | 38 | 39 | 40 | 41 | 42 | 43 | 44 | 45 | 46 | 47 | 48 | 49 |
|---|---|---|---|---|---|---|---|---|---|---|---|---|---|---|---|---|
| R= | 5 | 5 | 5 | 5 | 5 | 5 | 5 | 5 | 6 | 6 | 6 | 6 | 6 | 6 | 6 | 6 |
| L= | 1 | 1 | 1 | 1 | 1 | 1 | 4 | 1 | 1 | 1 | 1 | 1 | 1 | 1 | 2 | 1 |

| d= | 50 | 51 | 52 | 53 | 54 | 55 | 56 | 57 | 58 | 59 | 60 | 61 | 62 | 63 | 64 | 65 |
|---|---|---|---|---|---|---|---|---|---|---|---|---|---|---|---|---|
| R= | 7 | 7 | 7 | 7 | 7 | 7 | 7 | 7 | 8 | 8 | 8 | 8 | 8 | 8 | 8 | 8 |
| L= | 1 | 1 | 1 | 1 | 1 | 1 | 1 | 1 | 1 | 1 | 1 | 1 | 1 | 2 | 3 | 1 |

| d= | 66 | 67 | 68 | 69 | 70 | 71 | 72 | 73 | 74 | 75 | 76 | 77 | 78 | 79 | 80 | 81 |
|---|---|---|---|---|---|---|---|---|---|---|---|---|---|---|---|---|
| R= | 9 | 9 | 9 | 9 | 9 | 9 | 9 | 9 | 10 | 10 | 10 | 10 | 10 | 10 | 10 | 10 |
| L= | 1 | 1 | 1 | 1 | 2 | 2 | 3 | 1 | 1 | 1 | 1 | 1 | 1 | 1 | 2 | 8 |

| d= | 82 | 83 | 84 | 85 | 86 | 87 | 88 | 89 | 90 | 91 | 92 | 93 | 94 | 95 | 96 | 97 |
|---|---|---|---|---|---|---|---|---|---|---|---|---|---|---|---|---|
| R= | 11 | 11 | 11 | 11 | 11 | 11 | 11 | 11 | 12 | 12 | 12 | 12 | 12 | 12 | 12 | 12 |
| L= | 1 | 1 | 1 | 1 | 1 | 1 | 2 | 3 | 1 | 1 | 1 | 1 | 1 | 1 | 1 | 6 |

| d= | 98 | 99 | 100 | 101 | 102 | 103 | 104 | 105 | 106 | 107 | 108 | 109 | 110 | 111 | 112 | 113 |
|---|---|---|---|---|---|---|---|---|---|---|---|---|---|---|---|---|
| R= | 13 | 13 | 13 | 13 | 13 | 13 | 13 | 13 | 13 | 14 | 14 | 14 | 14 | 14 | 14 | 14 |
| L= | 1 | 1 | 1 | 1 | 1 | 1 | 1 | 1 | 1 | 1 | 1 | 1 | 2 | 1 | 2 | 3 |

FIG. 6a

Modified Codes over $GF(2^8)$ from Reed-Solomon codes over $GF(2^9)$,
Primitive Polynomial for $GF(2^{10})$ is $p(x) = x^{10} + x^3 + 1$

| d= | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|
| R= | 1 | 1 | 1 | 1 | 2 | 2 | 2 | 2 | 3 | 3 | 3 | 3 | 4 | 4 | 4 | 4 |
| L= | 2 | 2 | 1 | 1 | 1 | 1 | 1 | 1 | 1 | 1 | 1 | 1 | 1 | 1 | 3 | 3 |

| d= | 18 | 19 | 20 | 21 | 22 | 23 | 24 | 25 | 26 | 27 | 28 | 29 | 30 | 31 | 32 | 33 |
|---|---|---|---|---|---|---|---|---|---|---|---|---|---|---|---|---|
| R= | 5 | 5 | 5 | 5 | 6 | 6 | 6 | 6 | 7 | 7 | 7 | 7 | 8 | 8 | 8 | 8 |
| L= | 1 | 2 | 2 | 4 | 1 | 1 | 1 | 1 | 1 | 1 | 1 | 1 | 1 | 3 | 2 | 2 |

| d= | 34 | 35 | 36 | 37 | 38 | 39 | 40 | 41 | 42 | 43 | 44 | 45 | 46 | 47 | 48 | 49 |
|---|---|---|---|---|---|---|---|---|---|---|---|---|---|---|---|---|
| R= | 9 | 9 | 9 | 9 | 10 | 10 | 10 | 10 | 11 | 11 | 11 | 11 | 12 | 12 | 12 | 12 |
| L= | 1 | 1 | 1 | 5 | 1 | 1 | 1 | 3 | 1 | 1 | 1 | 1 | 1 | 1 | 1 | 2 |

| d= | 50 | 51 | 52 | 53 | 54 | 55 | 56 | 57 | 58 | 59 | 60 | 61 | 62 | 63 | 64 | 65 |
|---|---|---|---|---|---|---|---|---|---|---|---|---|---|---|---|---|
| R= | 13 | 13 | 13 | 13 | 14 | 14 | 14 | 14 | 15 | 15 | 15 | 15 | 16 | 16 | 16 | 16 |
| L= | 1 | 1 | 1 | 3 | 1 | 1 | 1 | 1 | 1 | 1 | 1 | 2 | 1 | 1 | 1 | 3 |

| d= | 66 | 67 | 68 | 69 | 70 | 71 | 72 | 73 | 74 | 75 | 76 | 77 | 78 | 79 | 80 | 81 |
|---|---|---|---|---|---|---|---|---|---|---|---|---|---|---|---|---|
| R= | 17 | 17 | 17 | 17 | 18 | 18 | 18 | 18 | 19 | 19 | 19 | 19 | 20 | 20 | 20 | 20 |
| L= | 1 | 2 | 1 | 2 | 1 | 1 | 1 | 1 | 1 | 1 | 1 | 5 | 1 | 1 | 1 | 5 |

| d= | 82 | 83 | 84 | 85 | 86 | 87 | 88 | 89 | 90 | 91 | 92 | 93 | 94 | 95 | 96 | 97 |
|---|---|---|---|---|---|---|---|---|---|---|---|---|---|---|---|---|
| R= | 21 | 21 | 21 | 21 | 22 | 22 | 22 | 22 | 23 | 23 | 23 | 23 | 24 | 24 | 24 | 24 |
| L= | 1 | 1 | 3 | 3 | 1 | 1 | 1 | 1 | 1 | 1 | 2 | 5 | 1 | 1 | 1 | 9 |

| d= | 98 | 99 | 100 | 101 | 102 | 103 | 104 | 105 | 106 | 107 | 108 | 109 | 110 | 111 | 112 | 113 |
|---|---|---|---|---|---|---|---|---|---|---|---|---|---|---|---|---|
| R= | 25 | 25 | 25 | 25 | 26 | 26 | 26 | 26 | 27 | 27 | 27 | 27 | 28 | 28 | 28 | 28 |
| L= | 1 | 1 | 1 | 5 | 1 | 1 | 1 | 1 | 1 | 1 | 1 | 20 | 1 | 1 | 4 | 2 |

FIG. 6b

Modified Reed Solomon Codes over $GF(2^8)$ from Reed Solomon Codes over $GF(2^{12})=GF(2^4)^3$ Primitive Polynomial for $GF(2^4)$ is $p(x)=x^4+x+1$

| d= | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|
| R= | 1 | 1 | 2 | 2 | 3 | 3 | 4 | 4 | 5 | 5 | 6 | 6 | 7 | 7 | 8 | 8 |
| L= | 1 | 1 | 1 | 1 | 1 | 1 | 1 | 1 | 1 | 1 | 1 | 1 | 1 | 1 | 1 | 1 |

| d= | 18 | 19 | 20 | 21 | 22 | 23 | 24 | 25 | 26 | 27 | 28 | 29 | 30 | 31 | 32 | 33 |
|---|---|---|---|---|---|---|---|---|---|---|---|---|---|---|---|---|
| R= | 9 | 9 | 10 | 10 | 11 | 11 | 12 | 12 | 13 | 13 | 14 | 14 | 15 | 15 | 16 | 16 |
| L= | 1 | 1 | 1 | 1 | 1 | 1 | 1 | 1 | 1 | 1 | 1 | 1 | 1 | 1 | 1 | 1 |

| d= | 34 | 35 | 36 | 37 | 38 | 39 | 40 | 41 | 42 | 43 | 44 | 45 | 46 | 47 | 48 | 49 |
|---|---|---|---|---|---|---|---|---|---|---|---|---|---|---|---|---|
| R= | 17 | 17 | 18 | 18 | 19 | 19 | 20 | 20 | 21 | 21 | 22 | 22 | 23 | 23 | 24 | 24 |
| L= | 1 | 1 | 1 | 1 | 1 | 1 | 1 | 1 | 1 | 1 | 1 | 1 | 1 | 1 | 1 | 1 |

| d= | 50 | 51 | 52 | 53 | 54 | 55 | 56 | 57 | 58 | 59 | 60 | 61 | 62 | 63 | 64 | 65 |
|---|---|---|---|---|---|---|---|---|---|---|---|---|---|---|---|---|
| R= | 25 | 25 | 26 | 26 | 27 | 27 | 28 | 28 | 29 | 29 | 30 | 30 | 31 | 31 | 32 | 32 |
| L= | 1 | 1 | 1 | 1 | 1 | 1 | 1 | 1 | 1 | 1 | 1 | 1 | 1 | 1 | 1 | 1 |

| d= | 66 | 67 | 68 | 69 | 70 | 71 | 72 | 73 | 74 | 75 | 76 | 77 | 78 | 79 | 80 | 81 |
|---|---|---|---|---|---|---|---|---|---|---|---|---|---|---|---|---|
| R= | 33 | 33 | 34 | 34 | 35 | 35 | 36 | 36 | 37 | 37 | 38 | 38 | 39 | 39 | 40 | 40 |
| L= | 1 | 1 | 1 | 1 | 1 | 1 | 1 | 1 | 1 | 1 | 1 | 1 | 1 | 1 | 1 | 1 |

| d= | 82 | 83 | 84 | 85 | 86 | 87 | 88 | 89 | 90 | 91 | 92 | 93 | 94 | 95 | 96 | 97 |
|---|---|---|---|---|---|---|---|---|---|---|---|---|---|---|---|---|
| R= | 41 | 41 | 42 | 42 | 43 | 43 | 44 | 44 | 45 | 45 | 46 | 46 | 47 | 47 | 48 | 48 |
| L= | 1 | 1 | 1 | 1 | 1 | 1 | 1 | 1 | 1 | 1 | 1 | 1 | 1 | 1 | 1 | 1 |

| d= | 98 | 99 | 100 | 101 | 102 | 103 | 104 | 105 | 106 | 107 | 108 | 109 | 110 | 111 | 112 | 113 |
|---|---|---|---|---|---|---|---|---|---|---|---|---|---|---|---|---|
| R= | 49 | 49 | 50 | 50 | 51 | 51 | 52 | 52 | 53 | 53 | 54 | 54 | 55 | 55 | 56 | 56 |
| L= | 1 | 1 | 1 | 1 | 1 | 1 | 1 | 1 | 1 | 1 | 1 | 1 | 1 | 1 | 1 | 1 |

MODIFIED REED SOLOMON CODE SELECTION AND ENCODING SYSTEM

FIELD OF THE INVENTION

The invention relates to a modified Reed-Solomon error correction encoder and a code search system for determining codes for use in the encoder.

BACKGROUND OF THE INVENTION

The importance of error correction coding of data in digital computer systems has increased greatly as the density of the data recorded on mass storage media, more particularly disks, has increased. With higher recording densities, a tiny imperfection in the recording surface of a disk can corrupt a large amount of data. In order to avoid losing that data, error correction codes ("ECC's") are employed to, as the name implies, correct the erroneous data.

Before a string of data symbols is written to a disk, it is mathematically encoded to form ECC symbols. The ECC symbols are then appended to the data string to form code words—data symbols plus ECC symbols—and the code words are written to or stored on the disks. When data is to be read from the disks, the code words containing the data symbols to be read are retrieved from the disks and mathematically decoded. During decoding any errors in the data are detected and, if possible, corrected through manipulation of the ECC symbols [For a detailed description of decoding see Peterson and Weldon, *Error Correction Codes,* 2d Edition, MIT Press, 1972].

Stored digital data can contain multiple errors. One of the most effective types of ECC used for the correction of multiple errors is a Reed-Solomon code [For a detailed description of Reed-Solomon codes, see Peterson and Weldon, *Error Correction Codes*]. To correct multiple errors in strings of data symbols, Reed-Solomon codes efficiently and effectively utilize the various mathematical properties of sets of symbols known as Galois Fields, represented "GF ($P^q$)", where "P" is a prime number and "q" can be thought of as the number of digits, base P, in each element or symbol in the field. "P" usually has the value 2 in digital computer applications and, therefore, "q" is the number of bits in each symbol.

The number of symbols which an ECC based on a Reed-Solomon code can effectively encode and correct, or "protect," is limited by the size of the Galois Field selected, i.e. $P^q$ symbols, and the maximum number of errors which the code is to be capable of correcting. The maximum length of a cyclic Reed-Solomon code word for GF ($P^q$) is $P^q-1$ symbols. Thus the maximum number of data symbols which can be protected by the ECC, that is, included in the code word, is $P^q-1$ symbols minus "e," where "e" is the number of ECC symbols. The larger the Galois Field, the longer the code word, and the more data the ECC can protect for a given maximum number of errors to be corrected. Therefore, larger Galois Fields could be used to protect larger strings of data symbols. However, using Galois Fields that do not result in 8-bit code word symbols, or symbols that contain a number of bits which is a multiple of eight, complicates the circuitry of the system.

Galois Field GF($2^8$) is a Galois Field which results in 8-bit ECC symbols. An ECC based on GF($2^8$) can protect a string of up to 253 8-bit data symbols or "data bytes" against a single error, if two 8-bit ECC symbols are appended to the data, making the code word 255 or $2^8-1$ bytes long. If the ECC is to correct more than one error, more ECC symbols, two for each additional error to be corrected, must be used in the code word. This means that fewer data bytes can be protected for a given length of code word.

Information is often stored on magnetic disks in sectors which are 512 or 576 bytes in length. Therefore, ECC's which are based on GF($2^8$) cannot, without complex manipulation of the code, protect an entire 512 or 576 byte sector. ECC's based on GF($2^{10}$) have sufficient code word length, i.e. $2^{10}-1$ or 1023 symbols per code word, to protect an entire sector. However, the encoding and decoding of the 10-bit symbols used in a GF($2^{10}$) code present certain problems.

More specifically, computer transmission and storage hardware is set up for bytes, i.e. 8-bit symbols, or symbols whose length are some multiple of 8-bits. Thus they are, in general, not arranged for manipulation of 10-bit symbols. Therefore, if a GF($2^{10}$) ECC is to be used, the information has to be translated back and forth between bytes and 10-bit symbols, first for encoding as 10-bit symbols, next for transmission and storage as bytes, and finally for decoding as 10-bit symbols. The requirement of translating between bytes and 10-bit symbols at both the encoder and the decoder adds the complexity of another step to the ECC coding process.

One technique which is used to protect an entire 512 or 576 byte sector with a GF($2^8$) ECC is to interleave the ECC GF($2^8$) code several times. Interleaving effectively splits the string of data symbols into several smaller segments, and treats each segment as a stream of data symbols to be encoded. The benefits of interleaving are that it permits a larger number of data symbols to be encoded by a given code, and that it effectively separates bursts of errors by encoding adjacent data symbols in different code words. On the other hand, interleaving typically involves two steps to encode, first separating the data to be encoded into several segments and then separately encoding each segment into a code word; and two steps to decode, first separately decoding the data and then combining the data symbols to recreate the original string of data symbols. Also, interleaving results in a less efficient code, since it required, for each interleaved code, extra ECC symbols for error detection. Alternatively, error detection is performed by an overlaid error detection code and associated error detection symbols, however, extra decoding operations are required.

Another problem with interleaved codes is that the error correction fails if there are too many errors in one of the data segments, even if the other data segments are essentially error-free.

One solution is to generate a code word in GF($2^{10}$) to protect up to 1023 bytes (data plus ECC symbols) and yet use 8-bit symbols, or bytes, as the ECC symbols. In a prior system one or more predetermined pseudo data bytes are appended to the data bytes and the string comprised of the data bytes plus the pseudo data bytes is encoded to produce the desired number of 10-bit ECC symbols. Then, two selected bits in each of the 10-bit ECC symbols are compared to a known 2-bit pattern, e.g. "00." If the selected two bits in each of the 10-bit ECC symbols are the same as the 2-bit pattern, the selected bits of the ECC symbols are ignored or truncated and the remaining 8 bits of each of the ECC symbols are concatenated with the data bytes and the appended pseudo data bytes to form the code word. The code word bytes can later be decoded, and any error correction performed, by appending the known 2-bit truncation pattern as necessary for Galois Field addition and/or multiplication.

If any of the selected bits in any of the ECC 10-bit symbols are not the same as the truncation pattern, the appended pseudo data bytes are modified such that encoding the data bytes plus the modified pseudo data bytes produces 10-bit ECC symbols with the selected bits the same as the truncation pattern. Then the selected bits, which are now the same as the known truncation pattern, are ignored and the remaining 8 bits of each of the ECC symbols and the modified pseudo data bytes are stored along with the data bytes as the code word. Again, the modified pseudo data bytes and the remaining 8 bits of the ECC symbols contain all the information necessary to allow the decoding and error correction of the code word as bytes.

The prior system is discussed in U.S. Pat. No. 4,856,003 entitled Error Correction Code Encoder, which is assigned to a common assignee. We have made improvements to the prior system, as discussed below. We have devised an error correction system that includes in a code word additional "pseudo" redundancy symbols, instead of including therein the pseudo data bytes. This allows the system, for example, to manipulate the data as 10-bit symbols and form the 10-bit ECC symbols in the conventional manner. The system then appends the ECC symbols to the data, modifies the ECC symbols that have bits that are not set in the preselected pattern, and appends to the code word the one or more pseudo redundancy symbols that contain the information necessary to decode the ECC symbols. This speeds up the encoding process over that used in the prior system, because the system need not modify the pseudo data symbols before appending the ECC symbols.

We have also invented a code search mechanism that readily determines the codes and pseudo symbols for use with the improved encoder. This mechanism allows an error correction system designer to select the number of bits in the preselected pattern, determine the code length and select the particular code and associated pseudo redundancy symbols that work best with a given error correction system. This is particularly important if longer codes are to be used to protect larger numbers of data bytes.

SUMMARY OF THE INVENTION

The improved Reed-Solomon error correction encoder encodes m-bit data symbols over $GF(2^{m+i})$ to produce (m+i)-bit ECC symbols. The encoder appends the ECC symbols to the data in a conventional manner to form a preliminary code word. The encoder then modifies the ECC symbols by combining the preliminary code word with a combination of one or more modifying code words. This results in modified ECC symbols that include the preselected pattern and in "R" pseudo redundancy symbols, which are appended to the modified ECC symbols. The encoder truncates the i-bit pattern from each of the ECC symbols and the pseudo-redundancy symbols, to produce a data code word that has symbols that are elements of $GF(2^m)$.

To decode the data code word, the decoder fills in the i-bit pattern in each of the code word symbols, to transform the symbols of the $GF(2^m)$ code word to symbols in $GF(2^{m+i})$. The system then decodes the code word in a conventional manner, treating the first R of the modified ECC symbols as code word data, or information, symbols, and the remaining modified ECC symbols and the pseudo redundancy symbols as code word ECC symbols.

A novel code search mechanism determines for the encoder the generator polynomial, g(x), and the code words that are used to modify the (m+i)-bit ECC symbols. As discussed in more detail below, the code search mechanism determines if a generator polynomial $g(x)=(x+\alpha^L)*(x+\alpha^{L+1}) \ldots *(x+\alpha^{L+d-2})$ produces a sufficient number of associated modifying code words that have one and only one selected bit of the i-bit pattern set to a one. If so, these code words or combinations of them are used to modify the ECC symbols into symbols that include the appropriate preselected i-bit pattern, and also to produce the pseudo redundancy symbol or symbols. If not, another generator polynomial is selected.

BRIEF DESCRIPTION OF THE DRAWINGS

The above and further advantages of the invention may be better understood by referring to the following description in conjunction with the accompanying drawings, in which:

FIGS. 2A and 2B are a flow chart of the operations of the encoder of FIG. 1;

FIGS. 3A and 3B are a flow chart of the code selector of FIG. 1;

FIGS. 6A and 6B are a chart listing codes determined using the operations described in FIG. 3;

FIG. 7 is a chart listing codes over $GF(2^{12})=GF(2^4)^3$;

DETAILED DESCRIPTION OF ILLUSTRATIVE EMBODIMENTS

Addition, multiplication and division operations discussed herein are Galois Field operations and modulo the generator polynomial g(x), and "*" represents multiplication.

1. The Encoder

Figure 1:
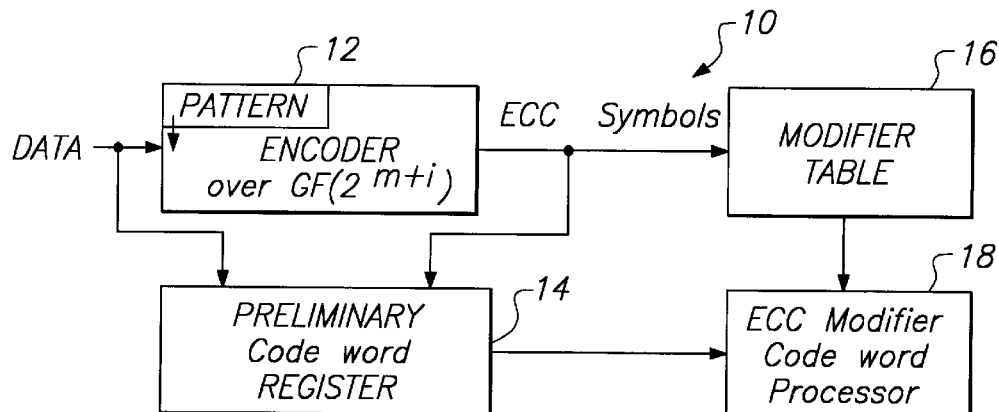
FIG. 1 is a functional block diagram of a system constructed in accordance with the invention.

Referring to FIG. 1, the modified Reed Solomon encoder 10 includes a $GF(2^{m+i})$ encoder 12 that encodes data in accordance with a generator polynomial g(x) over $GF(2^{m+i})$. Before data symbols, which are elements of $GF(2^m)$, are applied to the encoder an i-bit pattern is appended to or included in each of the symbols. The now (m+i)-bit data symbols are then encoded in a conventional manner, to produce (m+i)-bit ECC symbols. These symbols are appended to the data to form a preliminary code word in register 14.

The encoder 10 determines if all of the ECC symbols include the preselected i-bit pattern. If not, the encoder modifies the ECC symbols by combining in an ECC modifier code word processor 18 the preliminary code word and an ECC modifier code word that is essentially a combination of one or more modifying code words $r_c$, which each have a different one of the i bits set to a 1 and the other i–1 bits set to all zeros. The code words $r_c$ are stored in a modifying code word table 16, which as discussed below is addressed by the i bits of the ECC symbols.

More specifically, there are i*(d–1) modifying code words, one for each of the bits in the i-bit pattern in each of the d–1 ECC symbols. When a particular bit in a given (m+i)-bit ECC symbol is not set in the predetermined pattern, the encoder modifies the ECC symbols to alter that bit. The encoder essentially combines the ECC symbols with the appropriate symbols of the modifying code word that has the corresponding bit set to a 1, as discussed in more detail in the example below. If another of the bits of the ECC symbol is not set in the pattern, the ECC symbols are further modified by combining them also with the appropriate symbol of the modifying code word that has that particular bit set to a 1.

The processor 18 also produces R pseudo redundancy symbols, $P_1, P_2 \ldots P_R$, that are appended to the ECC symbols, to ensure proper decoding of the data code word. In order to include the R pseudo redundancy symbols in the data code word, the maximum number of data symbols in the data code word is reduced by R, to k−R. However, the code distance, d, remains the same. This results in a data code word that consists of (i) a maximum of k−R data symbols, (ii) d−1 modified ECC symbols and (iii) R pseudo-redundancy symbols, all with the i bits set in the selected pattern. Typically, fewer than k data symbols for example, k' data symbols, where k'<k, are included in the data code word. Accordingly, the R pseudo redundancy symbols are included in the data code word without a reduction in the number of data symbols. The data code word then contains k' data symbols, d−1 modified ECC symbols and the R pseudo redundancy symbols.

To decode the data code word, the first R of the modified ECC symbols are decoded as if they are data. If each of the data and the R modified ECC symbols are error free, the decoder produces (d−1)−R modified ECC symbols and the R pseudo redundancy symbols. Alternatively, the entire code word, including the pseudo redundancy symbols, is used in a conventional manner to produce the appropriate error syndromes.

The pseudo redundancy symbols are produced, in part, by encoding the modifying code words, $r_c$, that are required to modify the ECC symbols in the preliminary code word. These symbols must also have their i bits set in the predetermined pattern. Accordingly, an additional modifying code word S is included in the encoding, as discussed in more detail below. The modifying code words $r_c$ and the additional modifying code word S may be stored in the modifying code word table 16 that is addressed by the i bits of the ECC symbols. Alternatively, the table 16 may contain the first R non-zero symbols of each modifying code word $r_c$. These R symbols are then encoded to produce the corresponding code words and the code words combined to produce the additional modifying code word s, or the first d−1 non-zero coefficients of S may instead be stored in the table. If the system uses more than one i-bit pattern, for example, if it uses $2^i$ i-bit patterns, it may store in the table 16 $S_s$ additional modifying code words, where s=1, 2 ... $2^i$, or at least the first d−1 non-zero coefficients of each of these code words.

2. An Example over $GF(2^{3+2})$

We discuss the operations of the modified Reed Solomon encoder 10 that uses a code over $GF(2^5)$, with m=3 and i=2. All encoding operations are over $GF(2^5)$, and the resulting data code word includes both data and ECC symbols that are elements of $GF(2^3)$.

For $GF(2^5)$, the primitive polynomial is $p(x)=x^5+x^2+1$ and the selected code is a (31,27) distance 5 code with a generator polynomial:

$$g(x) = (x+\alpha^2)*(x+\alpha^3)*(x+\alpha^4)*(x+\alpha^5)$$
$$= x^4 + \alpha^{25}x^3 + \alpha^{21}x^2 + \alpha x + \alpha^{14}$$

The selection of the code is discussed below with reference to FIG. 3. The preselected pattern is "10" and it is the leading two bits of the symbols.

As discussed also in more detail below, with reference to FIGS. 3 and 4, we select i*(d−1), or 8, modifying code words $r_c$ of $GF(2^{m+i})$. Each code word includes in one of the first d−1, or 4, symbols a two-bit pattern that consists of a single bit that is set to a one and a single bit that is set to a zero. The other code word symbols have their i bits set to all 0s. The code words can be denoted as polynomials with the code word symbols as coefficients of corresponding powers of x. Further, the coefficients can be written as 1-by-(m+i)-bit matrices. Using this notation, the 8 modifying code words $r_c$ are:

| | $x^3$ | $x^2$ | $x^1$ | $x^0$ | $x^{-1}$ | $x^{-2}$ | $x^{-3}$ |
|---|---|---|---|---|---|---|---|
| | 1 | 0 | 0 | 0 | 0 | 0 | 0 |
| | 0 | 0 | 0 | 0 | 0 | 0 | 0 |
| $r_7 =$ | 1 | 0 | 1 | 1 | 0 | 1 | 0 |
| | 0 | 1 | 1 | 0 | 0 | 0 | 1 |
| | 0 | 0 | 0 | 0 | 1 | 1 | 1 |
| | 0 | 1 | 0 | 0 | 0 | 0 | 0 |
| | 0 | 0 | 0 | 0 | 0 | 0 | 0 |
| $r_6 =$ | 0 | 1 | 0 | 1 | 1 | 1 | 1 |
| | 1 | 0 | 0 | 1 | 0 | 0 | 1 |
| | 1 | 0 | 0 | 0 | 0 | 1 | 0 |
| | 0 | 0 | 1 | 0 | 0 | 0 | 0 |
| | 0 | 0 | 0 | 0 | 0 | 0 | 0 |
| $r_5 =$ | 1 | 1 | 0 | 1 | 0 | 1 | 0 |
| | 1 | 0 | 1 | 1 | 0 | 0 | 1 |
| | 1 | 1 | 0 | 1 | 0 | 1 | 1 |
| | 0 | 0 | 0 | 1 | 0 | 0 | 0 |
| | 0 | 0 | 0 | 0 | 0 | 0 | 0 |
| $r_4 =$ | 1 | 0 | 1 | 1 | 1 | 1 | 1 |
| | 1 | 1 | 1 | 0 | 0 | 0 | 0 |
| | 0 | 1 | 0 | 1 | 1 | 1 | 0 |
| | 0 | 0 | 0 | 0 | 0 | 0 | 0 |
| | 1 | 0 | 0 | 0 | 0 | 0 | 0 |
| $r_3 =$ | 0 | 1 | 0 | 1 | 0 | 0 | 1 |
| | 0 | 0 | 0 | 0 | 0 | 0 | 0 |
| | 1 | 1 | 1 | 1 | 0 | 0 | 0 |
| | 0 | 0 | 0 | 0 | 0 | 0 | 0 |
| | 0 | 1 | 0 | 0 | 0 | 0 | 0 |
| $r_2 =$ | 1 | 0 | 1 | 1 | 1 | 0 | 1 |
| | 1 | 1 | 1 | 1 | 0 | 1 | 1 |
| | 1 | 0 | 1 | 1 | 0 | 1 | 1 |
| | 0 | 0 | 0 | 0 | 0 | 0 | 0 |
| | 0 | 0 | 1 | 0 | 0 | 0 | 0 |
| $r_1 =$ | 0 | 0 | 0 | 1 | 1 | 0 | 1 |
| | 0 | 0 | 1 | 1 | 0 | 1 | 0 |
| | 1 | 0 | 1 | 0 | 0 | 0 | 1 |
| | 0 | 0 | 0 | 0 | 0 | 0 | 0 |
| | 0 | 0 | 0 | 1 | 0 | 0 | 0 |
| | 1 | 1 | 1 | 1 | 0 | 0 | 1 |
| $r_0 =$ | 0 | 1 | 0 | 0 | 0 | 0 | 1 |
| | 0 | 1 | 0 | 0 | 0 | 1 | 1 |
| | $x^3$ | $x^2$ | $x^1$ | $x^0$ | $x^{-1}$ | $x^{-2}$ | $x^{-3}$ |

Note that, for example, the modifying code word $r_7$ has as the coefficient of $x^3$ a symbol with a two-bit pattern that has the leading bit set to a 1 and the other bit set to a 0, and as each of the other coefficients symbols with the two bits set to all 0s. Similarly, the modifying code word $r_6$ has as the coefficient of $x^2$ a symbol with a two-bit pattern that has the leading bit set to 1 and the remaining bit set to 0, and as each of the other coefficients symbols with the two bits set to all 0s. The modifying code words $r_c$, $(i*(d-1))-1 \geq c \geq d-1$, in the example $7 \geq c \geq 4$, have the two-bit pattern "10" included in the coefficient of $x^{c-(d-1)}$. The code words $r_c$, $c<d-1$, have the two-bit pattern "01" included in the coefficient of $x^c$. We discuss below with reference to FIG. 3 and alternatively with reference to FIG. 4 how the code words are selected.

For decoding, R pseudo-redundancy symbols, $P_1$, $P_2$, ... $P_R$, are appended to the modified ECC symbols and are included in the data code word, where:

$$R = \left\lceil \frac{i * deg(g(x))}{m} \right\rceil$$

and deg (g(x)) is the degree of the generator polynomial g(x) and [ ] represents the ceiling function. In the example, R=3. To include these three symbols in the data code word, the maximum number of data symbols is reduced by three, from 27 to 24. The data code word thus has a maximum of 24 data symbols, 4 ECC symbols and 3 pseudo redundancy symbols.

To ensure that the pseudo redundancy symbols include the preselected i-bit pattern, the system encodes along with the selected modifying code words $r_c$ an additional modifying code word S, which has the i bits set in the predetermined pattern in certain of its coefficients and the i bits set to all zeros in the remaining coefficients. We discuss below with reference to FIG. 3 how the additional modifying code word is determined. In the example, the additional modifying code word is:

$$S = \begin{matrix} 0 & 0 & 0 & 0 & 1 & 1 & 1 \\ 0 & 0 & 0 & 0 & 0 & 0 & 0 \\ 1 & 0 & 0 & 0 & 0 & 0 & 1 \\ 1 & 0 & 1 & 0 & 0 & 0 & 0 \\ 0 & 0 & 1 & 0 & 0 & 1 & 1 \\ x^3 & x^2 & x^1 & x^0 & x^{-1} & x^{-2} & x^{-3} \end{matrix}$$

Note that the i bits are all 0s in the coefficients of $x^3$ to $x^0$, which correspond to the positions of the ECC symbols in the preliminary code word. This code word S may be stored in the modifier table 16, or it may be produced in the encoder from a linear combination of the modifying code words $r_c$. Alternatively, the first three coefficients of the code word S may be stored in the table 16 and the code word produced by encoding these symbols.

Figure 2A:
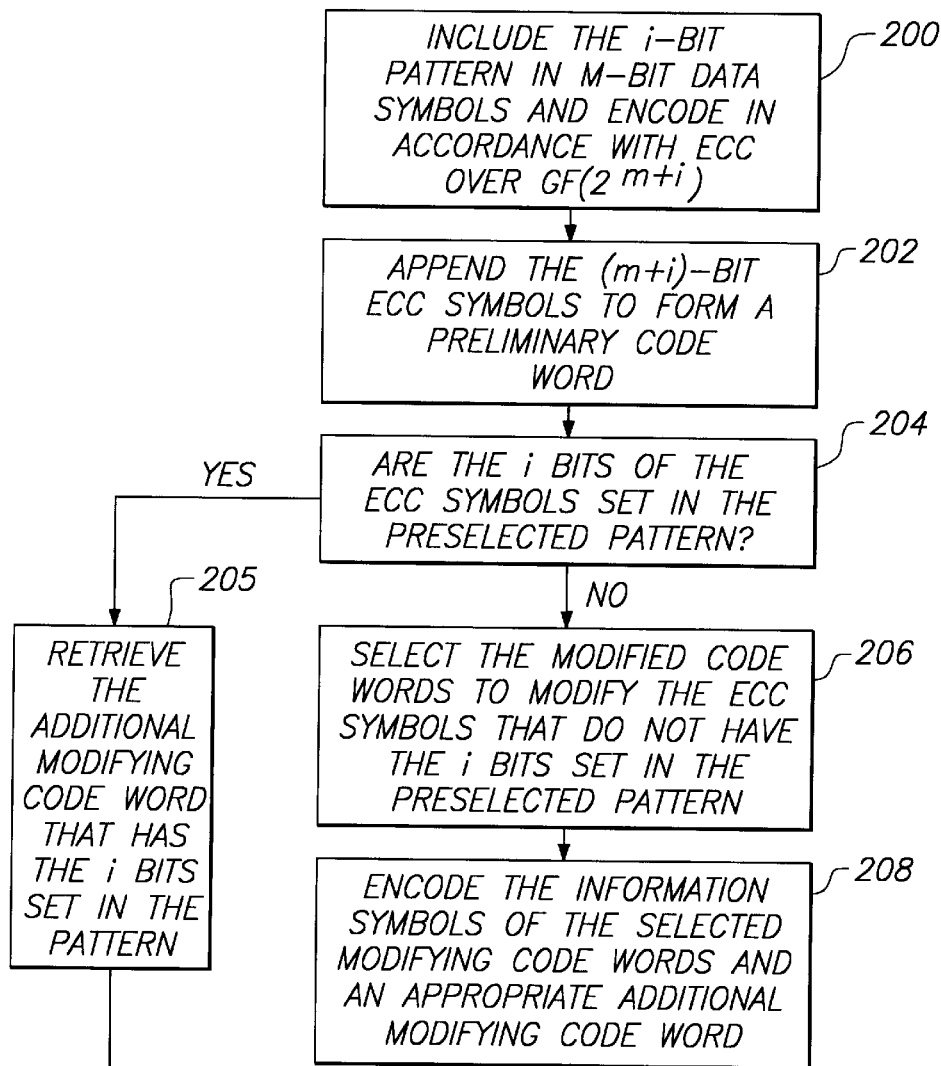

Referring now also to FIG. 2, the encoder 10 in step 200 encodes k' three-bit data symbols:

$$\begin{matrix} 0 & 1 & 1 & 0 & 0 \\ 1 & 1 & 1 & 0 & 0 \\ 1 & 1 & 0 & 0 & 1 \\ x^8 & x^7 & x^6 & x^5 & x^4 \end{matrix}$$

by appending two bits set in the preselected pattern to each of the symbols and encoding them in a conventional manner. The data symbols that are coefficients of $x^9$, $x^{10}$ and so forth are all-zero symbols and are not shown. The result of the encoding (step 202) is the preliminary code word:

$$\begin{matrix} 1 & 1 & 1 & 1 & 1 & 0 & 1 & 0 & 1 \\ 0 & 0 & 0 & 0 & 0 & 0 & 0 & 1 & 0 \\ 0 & 1 & 1 & 0 & 0 & 1 & 1 & 0 & 0 \\ 1 & 1 & 1 & 0 & 0 & 1 & 1 & 0 & 0 \\ 1 & 1 & 0 & 0 & 1 & 0 & 1 & 1 & 0 \\ x^8 & x^7 & x^6 & x^5 & x^4 & x^3 & x^2 & x^1 & x^0 \end{matrix}$$

The ECC symbols, which are the coefficients of $x^3$ to $x^0$, include two symbols with their leading bits set in the preselected pattern, namely, the coefficients of $x^2$ and $x^0$. Two of the ECC symbols, namely, the coefficients of $x^3$ and $x^1$, must be modified to include the pre-selected 2-bit pattern (step 204).

The ECC symbol that corresponds to $x^3$ has "00" as the first two bits. To modify this symbol, the system in step 206 selects the modifying code word $r_7$, which is the code word that includes in the coefficient of $x^3$ a 1 in the leading bit position. To modify the ECC symbol that corresponds to $x^1$, which has "01" as the first two bits, the system selects the modifying code words $r_5$ and $r_1$, which have 1s respectively in the first and second positions of the coefficients of $x^1$. The system in step 208 then combines and encodes the first three "information" symbols of each of the selected modifying code words and the appropriate symbols from the additional modifying code word S, to produce the ECC modifier code word that (i) modifies the four ECC symbols and (ii) appends to the ECC symbols the three pseudo redundancy symbols.

The system selects the modifying code words by addressing the look-up table 16 with the two-bit patterns of the ECC symbols. The contents of table 16, which are the code words $r_c$ and S or at least the first R, or three, coefficients of these code words, are associated with the particular generator polynomial and i-bit pattern selected, as discussed below with reference to FIG. 3. If only the first R coefficients are included in the table 16, the system encodes the coefficients to produce the corresponding modifying and additional modifying code words.

In the example, the ECC modifier code word that includes the three pseudo redundancy symbols, $P_1$, $P_2$, and $P_3$ is formed by combining the corresponding information symbols of each of $r_7$, $r_5$, $r_1$ and S:

$$\begin{matrix} & 1 & 0 & 0 & 0 & 1 \\ & 0 & 0 & 0 & 0 & 0 \\ \text{information symbol at } x^3 & 1 & + 1 & + 0 & + 1 & = 1 \\ & 0 & 1 & 0 & 1 & 0 \\ & 0 & 1 & 1 & 0 & 0 \\ \\ & 0 & 0 & 0 & 0 & 0 \\ & 0 & 0 & 0 & 0 & 0 \\ \text{information symbol at } x^2 & 0 & + 1 & + 0 & + 0 & = 1 \\ & 1 & 0 & 0 & 0 & 1 \\ & 0 & 1 & 0 & 0 & 1 \\ \\ & 0 & 1 & 0 & 0 & 1 \\ & 0 & 0 & 1 & 0 & 1 \\ \text{information symbol at } x^1 & 1 & + 0 & + 0 & + 0 & = 1 \\ & 1 & 1 & 1 & 1 & 0 \\ & 0 & 0 & 1 & 1 & 0 \end{matrix}$$

and encoding these information symbols to produce the code word:

|       |       |       |       |          |          |          |
|-------|-------|-------|-------|----------|----------|----------|
| 1     | 0     | 1     | 0     | 1        | 1        | 1        |
| 0     | 0     | 1     | 0     | 0        | 0        | 0        |
| 1     | 1     | 1     | 1     | 1        | 0        | 0        |
| 0     | 1     | 0     | 0     | 0        | 1        | 0        |
| 0     | 1     | 0     | 1     | 1        | 1        | 0        |
| $x^3$ | $x^2$ | $x^1$ | $x^0$ | $x^{-1}$ | $x^{-2}$ | $x^{-3}$ |

This code word includes coefficients that modify the ECC symbols, namely, the coefficients of $x^3$ to $x^0$, and coefficients that are the pseudo redundancy symbols, namely, the coefficients of $x^{-1}$ to $x^{-3}$. In step 210 the system combines this code word with the preliminary code word, such that the ECC symbols are modified and three pseudo redundancy symbols are appended to the ECC symbols. The result is the data code word:

|       |       |       |       |       |       |       |       |       |          |          |          |
|-------|-------|-------|-------|-------|-------|-------|-------|-------|----------|----------|----------|
| 1     | 1     | 1     | 1     | 1     | 1     | 1     | 1     | 1     | 1        | 1        | 1        |
| 0     | 0     | 0     | 0     | 0     | 0     | 0     | 0     | 0     | 0        | 0        | 0        |
| 0     | 1     | 1     | 0     | 0     | 0     | 0     | 1     | 1     | 1        | 0        | 0        |
| 1     | 1     | 1     | 0     | 0     | 1     | 0     | 0     | 0     | 0        | 1        | 0        |
| 1     | 1     | 0     | 0     | 1     | 0     | 0     | 1     | 1     | 1        | 1        | 0        |
| $x^8$ | $x^7$ | $x^6$ | $x^5$ | $x^4$ | $x^3$ | $x^2$ | $x^1$ | $x^0$ | $x^{-1}$ | $x^{-2}$ | $x^{-3}$ |

Each symbol of the data code word has the two leading bits set in the preselected pattern. The system then truncates the leading bits and transmits the data code word as a code word in $GF(2^m)$ (steps 212, 214).

To decode the data code word the decoder decodes the data code word in a conventional manner treating the coefficients of $x^8$ to $x^1$ as data and the coefficients $x^0$ to $x^{-3}$ as redundancy symbols. The decoder then computes the error syndromes and error values in a conventional manner.

3. Selecting the Code

As discussed above, a code over $GF(2^{m+i})$ is selected by determining if it includes a sufficient number of modifying code words $r_c$. The code must include $i*(d-1)$ modifying code words $r_c$, which in the example is 8 modifying code words.

Figure 3B:
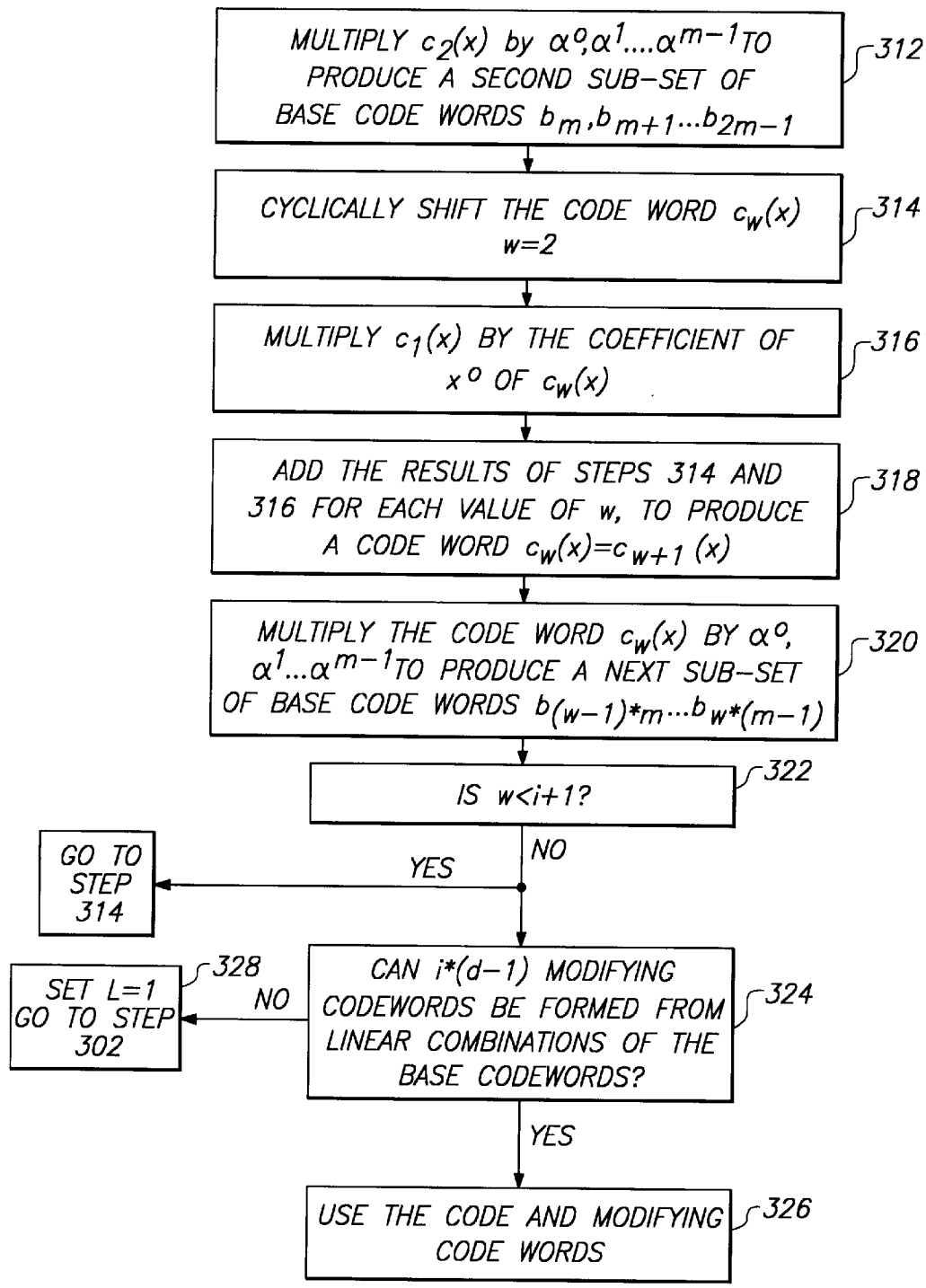

Referring now to FIG. 3, the user selects the desired code parameters such as code distance, $d=n-k+1$, and the system sets L=0 (step 300) and tries as a generator polynomial:

$$g(x)=(x+\alpha^L)*(x+\alpha^{L+1})* \ldots (x+\alpha^{L+n-k-1})=x^{n-k}+g_{n-k-1}x^{n-k-1}+ \ldots +g_1x^1+g_0x^0$$

L is the lowest root of $g(x)$, and thus, this $g(x)$ has a root $\alpha^0$ or 1.

Next, the system produces from the generator polynomial $i*(d-1)$ base code words from which it derives, if possible, the $i*(d-1)$ modifying code words. The system first divides $g(x)$ by $g_0$, to produce in step 302 a code word $c_1(x)$ that has $\alpha^0$, or 1, as the coefficient of $x^0$:

$$c_1(x) = \frac{g(x)}{g_0} = g'_{n-k}x^{n-k} + g'_{n-k-1}x^{n-k-1} + \ldots + g'_1 x + 1x^0$$

where $$g'_i = \frac{g_i}{g_0}.$$

The coefficients of $x^{-1}$, $x^{-2}$ and $x^{-3}$ are zeros, and the code word $c_1(x)$ is thus:

$$c_1'(x) = g'_{n-k}x^{n-k} + g'_{n-k-1}x^{n-k-1} + \ldots + g'_1 x + 1x^0 + 0x^{-1} + 0x^{-2} + 0x^{-3}$$

The system in step 304 next, cyclically shifts this code word, that is, multiplies it by $x^{-1}$, to produce a code word $c_1(x)$ with a coefficient of 1 for $x^{-1}$:

$$c_1(x) = g_{n-k+1}'x^{n-k} + g'_{n-k}x^{n-k-1} + \ldots + g'_1x^0 + 1x^{-1} + 0x^{-2} + 0x^{-3}$$

and multiplies this code word by $\alpha^0, \alpha^1 \ldots \alpha^{m-1}$ to produce a first sub-set of base code words $b_0, b_1, b_2 \ldots b_{m-1}$ that have, respectively, a coefficient of 00001, 00010, 00100 and so forth at the position that corresponds to $x^{-1}$.

The code word $c_1(x)$ is further manipulated to produce code words $c_t(x)$ $t=2, \ldots i+1$ that have, respectively, a single coefficient of one in a position that corresponds to $x^{-2}, \ldots, $ or $x^{-R}$ and $m+i-1$ all-zero coefficients in the remaining positions. The system in step 306 first multiplies $c_1(x)$ by $x^{-1}$, which is another cyclic shift:

$$x^{-1}*c_1(x) = g'_{n-k+1}x^{n-k} + g'_{n-k}x^{n-k-1} + g'_{n-k-1}x^{n-k-2} + \ldots + g'_0 x^{-1} + 1x^{-2} + 0x^{-3}$$

then, in step 308, multiplies $c_1(x)$ by $g'_0$:

$$c_1(x)*g'_0 = g'_0*g'_{n-k}x^{n-k-1} + g'_0*g_{n-k-1}x^{n-k-2} + \ldots + g'_0*g'_1x^0 + g'_0x^{-1} + 0x^{-2} + 0x^{-3}$$

and in step 310 adds $x^{-1}*c_1(x) + c_1(x)*g'_1$ to produce the code word:

$$c_2(x) = g''_{n-k}x^{n-k} + g''_{n-k-1}x^{n-k-1} + \ldots + g''_0x^0 + 0x^{-1} + 1x^{-2} + 0x^{-3}$$

This code word has all zero coefficients in the positions that correspond to $x^{-1}, x^{-3} \ldots x^{-R}$ and a coefficient of 1, or 00001, in the position that corresponds to $x^{-2}$.

In step 312, the system multiplies the code word $c_2(x)$ by $\alpha^0, \alpha^1 \ldots \alpha^{m-1}$ to produce a second sub-set of base code words $b_3, b_4$ and $b_5$ that have, respectively, a coefficient of 00001, 00010 and 00100, at the position that corresponds to $x^{-2}$.

Similarly, by manipulating $c_1(x)$ and $c_2(x)$ the system produces a third sub-set of base code words $b_6, b_7$ and $b_8$ that have, respectively, a coefficient of 00001, 00010 and 00100, in the position that corresponds to $x^{-3}$. The system thus in step 314 cyclically shifts $c_2(x)$, that is, multiplies $c_2(x)$ by $x^{-1}$:

$$x^{-1}*c_2(x) = g''_{n-k}x^{n-k-1} + g''_{n-k-1}x^{n-k-2} + \ldots + g''_0x^{-1} + 0x^{-2} + 1x^{-3}$$

multiplies in step 316 $c_1(x)$ by $g''_0$:

$$c_1(x)*g''_0 = g''_0*g'_{n-k-1}x^{n-k} + g''_0*g'_{n-k-1}x^{n-k-1} + \ldots + g''_0*g'_1x^0 + g''_0x^{-1} + 0x^{-2} + 0x^{-3}$$

and in step 318 adds $x^{-1}*c_2(x) + c_1(x)*g''_0$ to produce a code word:

$$c_3(x) = g'''_{n-k}x^{n-k} + g'''_{n-k-1}x^{n-k-1} + \ldots + g'''_0x^0 + 0x^{-1} + 0x^{-2} + 1x^{-3}$$

Using $c_3(x)$ the system in step 320 produces the $(i+1)^{st}$, or third, subset of code words by multiplying $c_3(x)$ by $\alpha^0, \alpha^1, \ldots, \alpha^{m-1}$. The base code words $b_0$ to $b_8$ are:

$$b_0 = \begin{array}{ccccccc} x^3 & x^2 & x^1 & x^0 & x^{-1} & x^{-2} & x^{-3} \\ 1 & 0 & 1 & 0 & 0 & 0 & 0 \\ 0 & 0 & 0 & 0 & 0 & 0 & 0 \\ 0 & 1 & 1 & 1 & 0 & 0 & 0 \\ 1 & 1 & 0 & 1 & 0 & 0 & 0 \\ 1 & 1 & 0 & 1 & 1 & 0 & 0 \end{array}$$

$$b_1 = \begin{array}{ccccccc} 0 & 0 & 0 & 0 & 0 & 0 & 0 \\ 0 & 1 & 1 & 0 & 0 & 0 & 0 \\ 0 & 1 & 1 & 1 & 0 & 0 & 0 \\ 1 & 1 & 0 & 1 & 1 & 0 & 0 \\ 1 & 0 & 1 & 0 & 0 & 0 & 0 \end{array}$$

-continued $$b_2 = \begin{array}{cccccccc} 0 & 1 & 1 & 0 & 0 & 0 & 0 \\ 0 & 1 & 1 & 1 & 0 & 0 & 0 \\ 1 & 1 & 0 & 1 & 1 & 0 & 0 \\ 1 & 0 & 1 & 0 & 0 & 0 & 0 \\ 0 & 0 & 0 & 0 & 0 & 0 & 0 \end{array}$$

$$b_3 = \begin{array}{cccccccc} 1 & 1 & 1 & 1 & 0 & 0 & 0 \\ 0 & 1 & 1 & 0 & 0 & 0 & 0 \\ 0 & 1 & 0 & 0 & 0 & 0 & 0 \\ 0 & 1 & 1 & 0 & 0 & 0 & 0 \\ 0 & 0 & 0 & 1 & 0 & 1 & 0 \end{array}$$

$$b_4 = \begin{array}{cccccccc} 0 & 1 & 1 & 0 & 0 & 0 & 0 \\ 0 & 0 & 1 & 0 & 0 & 0 & 0 \\ 1 & 0 & 0 & 1 & 0 & 0 & 0 \\ 0 & 0 & 0 & 1 & 0 & 1 & 0 \\ 1 & 1 & 1 & 1 & 0 & 0 & 0 \end{array}$$

$$b_5 = \begin{array}{cccccccc} 0 & 0 & 1 & 0 & 0 & 0 & 0 \\ 1 & 0 & 0 & 1 & 0 & 0 & 0 \\ 0 & 1 & 1 & 1 & 0 & 1 & 0 \\ 1 & 1 & 1 & 1 & 0 & 0 & 0 \\ 0 & 1 & 1 & 0 & 0 & 0 & 0 \end{array}$$

$$b_6 = \begin{array}{cccccccc} 0 & 0 & 0 & 0 & 0 & 0 & 0 \\ 1 & 1 & 1 & 1 & 0 & 0 & 0 \\ 0 & 0 & 0 & 0 & 0 & 0 & 0 \\ 1 & 0 & 0 & 0 & 0 & 0 & 0 \\ 1 & 0 & 1 & 0 & 0 & 0 & 1 \end{array}$$

$$b_7 = \begin{array}{cccccccc} 1 & 1 & 1 & 1 & 0 & 0 & 0 \\ 0 & 0 & 0 & 0 & 0 & 0 & 0 \\ 1 & 0 & 0 & 0 & 0 & 0 & 0 \\ 1 & 0 & 1 & 0 & 0 & 0 & 1 \\ 0 & 0 & 0 & 0 & 0 & 0 & 0 \end{array}$$

$$b_8 = \begin{array}{ccccccc} 0 & 0 & 0 & 0 & 0 & 0 & 0 \\ 1 & 0 & 0 & 0 & 0 & 0 & 0 \\ 0 & 1 & 0 & 1 & 0 & 0 & 1 \\ 0 & 0 & 0 & 0 & 0 & 0 & 0 \\ 1 & 1 & 1 & 0 & 0 & 0 & 0 \end{array}$$

$$x^3 \quad x^2 \quad x^1 \quad x^0 \quad x^{-1} \quad x^{-2} \quad x^{-3}$$

Next, the system in step 322 determines if it can produce from linear combinations of the base code words eight modifying code words that have, respectively, all but one of the coefficients with the two-bit patterns set to all zeros. The one coefficient, which corresponds to an ECC symbol in the preliminary code word, has a two-bit pattern with a single bit set to a 1 and the remaining bit set to a 0. The full set of modifying code words includes d−1, or four, code words with the first bit of the two-bit pattern set to a 1, one for each of the four redundancy symbols, and four code words with the second bit of the two-bit pattern set to a 1, one for each of the four redundancy symbols.

The system next determines if 8 modifying code words can be produced from linear combinations of the base code words. In this embodiment the system does this by forming a 9-by-8 matrix $M_1$ using the coefficients of the code words $b_0, b_1, \ldots b_8$. The rows of the matrix $M_1$ consist, respectively, of the leading two bits of the coefficients in positions that correspond to $x^{d-2} x^{d-3} \ldots x^0$.

In the example the matrix $M_1$ is:

$$b_0: \quad 1\ 0\ 1\ 0\ 0\ 0\ 0\ 0$$
$$b_1: \quad 0\ 0\ 0\ 0\ 0\ 1\ 1\ 0$$
$$b_2: \quad 0\ 1\ 1\ 0\ 0\ 1\ 1\ 1$$
$$b_3: \quad 1\ 1\ 1\ 1\ 0\ 1\ 1\ 0$$
$$b_4: = M_1\ 0\ 1\ 1\ 0\ 0\ 0\ 1\ 0$$
$$b_5: \quad 0\ 0\ 1\ 0\ 1\ 0\ 0\ 1$$
$$b_6: \quad 0\ 0\ 0\ 0\ 1\ 1\ 1\ 1$$
$$b_7: \quad 1\ 1\ 1\ 1\ 0\ 0\ 0\ 0$$
$$b_8: \quad 0\ 0\ 0\ 0\ 1\ 0\ 0\ 0$$

If the matrix $M_1$ has a rank of i*(d−1) or in the example 8, which is the required number of modifying code words, the system finds an 8-by-9 matrix A, which is the "pseudo inverse" of the matrix $M_1$. The product of the matrix $M_1$ and the matrix A is an 8-by-8 identity matrix I. In the example:

$$A = \begin{array}{ccccccccc} 1 & 1 & 0 & 0 & 0 & 1 & 1 & 0 & 0 \\ 0 & 1 & 1 & 0 & 0 & 1 & 0 & 0 & 1 \\ 0 & 1 & 0 & 0 & 0 & 1 & 1 & 0 & 0 \\ 1 & 0 & 1 & 1 & 0 & 1 & 0 & 0 & 1 \\ 0 & 0 & 0 & 0 & 0 & 0 & 0 & 0 & 1 \\ 0 & 1 & 1 & 0 & 1 & 0 & 1 & 0 & 1 \\ 0 & 0 & 1 & 0 & 1 & 0 & 1 & 0 & 1 \\ 0 & 1 & 0 & 0 & 0 & 0 & 1 & 0 & 1 \end{array}$$

The modifying code words $r_c$ are then produced by multiplying the matrix A by a 1-by-9 matrix whose rows are $b_0, b_1 \ldots b_8$. Thus, each row of the pseudo inverse matrix A produces one modifying code word $r_c$. Accordingly, if the rank of $M_1$ is not equal to the number of required modifying code words, the system cannot use the code generated by the selected g(x).

If g(x) cannot be used, the system next sets L=1 and tries the code generated by $g(x)=(x-\alpha^L)^* \ldots (x+\alpha^{L+d-1})$. FIG. 6 is a chart listing by the lowest root L, the code distance d and the number R of pseudo redundancy symbols codes up to distance 113 determined using this search method. Codes with greater distances can be readily determined using the search method.

The additional modifier code word S, which is included in the encoding of the pseudo redundancy symbols to ensure that these symbols include the i-bit pattern, is produced by (1) encoding R information symbols that have the i bits set in the preselected pattern and m all zero bits and k−R all zero symbols, to produce a code word with d−1 redundancy symbols, (2) cyclically shifting that code word until the R symbols are the coefficients of $x^{-1}$ to $x^{-3}$ and the d−1 symbols are the coefficients of $x^3$ to $x^0$, and (3) combining the code word with the appropriate code words $r_c$ to modify the coefficients of $x^3$ to $x^0$ to produce coefficients with i-bit patterns of all 0s. For example, the additional modifying code word S, in the example, which has the i bits set to the pattern "10" in the coefficients of $x^{-1}$ to $x^{-3}$, is produced by encoding:

$$\begin{matrix} 1 & 1 & 1 \\ 0 & 0 & 0 \\ 0 & 0 & 0 \\ 0 & 0 & 0 \\ 0 & 0 & 0 \end{matrix}$$

to produce a code word with these R symbols and d−1 redundancy symbols and cyclically shifting the code word to produce a code word S':

$$S' = \begin{matrix} 1 & 1 & 1 & 1 & 1 & 1 & 1 \\ 0 & 0 & 0 & 1 & 0 & 0 & 0 \\ 0 & 1 & 1 & 1 & 0 & 0 & 0 \\ 1 & 1 & 1 & 0 & 0 & 0 & 0 \\ 0 & 1 & 0 & 0 & 0 & 0 & 0 \\ x^3 & x^2 & x^1 & x^0 & x^{-1} & x^{-2} & x^{-3} \end{matrix}$$

that has the R information symbols as coefficients of $x^{-1}$ to $x^{-5}$.

This code word is then further encoded by combining it with selected code words $r_c$ to produce the code word S that has the i bits set to all 0s in the coefficients of $x^3$ to $x^0$. Thus S' is combined with $r_7$, $r_6$, $r_5$, $r_4$ and $r_0$ to produce:

$$S = \begin{matrix} 0 & 0 & 0 & 0 & 1 & 1 & 1 \\ 0 & 0 & 0 & 0 & 0 & 0 & 0 \\ 1 & 0 & 0 & 0 & 0 & 0 & 1 \\ 1 & 0 & 1 & 0 & 0 & 0 & 0 \\ 0 & 0 & 1 & 0 & 0 & 1 & 1 \end{matrix}$$

If more than one pattern may be selected, the system similarly produces additional modifying code words $S_s$, s=1, 2 ... $2^i$, associated with each of the i-bit patterns. Thus, a set of R symbols with their i-bits set in a selected pattern and m all zero bits are encoded and the results combined, as necessary, to produce the corresponding code word $S_s$ for each of the selected patterns.

4. A Method of Minimizing the Modifying Code Word Table

The modifying code word table 16, as described above, contains for each ECC symbol the coefficients of two modifying code words, one associated with each bit in the two-bit pattern. Thus for a d=3 code, which has two ECC symbols, we must determine four modifying code words to eliminate from the ECC symbols the two-bit pattern. The modifying code words are determined separately, since one code word can not be readily determined from another one.

When the code is over a Galois Field $GF(2^{m+i})$, in which $GF(2^m)=GF(2^t)^h$ and $GF(2^{m+i})=GF(2^t)^{h+j}$, the system reduces the size of the modifying code word table from i*(d−1) locations to j*(d−1) locations by using as a ground field $GF(2^t)$ instead of $GF(2)$. Codes over $GF(2^6)$, which are $GF(2^{4+2})$ with $GF(2^m)=GF(2^2)^2$ and $GF(2^{m+i})=GF(2^2)^3$ have ground fields of $GF(2^2)$, with j=1. For a d=3 code that uses a 2-bit pattern, the table size is reduced from 2*(3−1) or 4 locations, for storing coefficients of two modifying code words for every ECC symbol, to 1*(3−1) or 2 locations, for storing coefficients of one modifying code word for every ECC symbol. Only a single location is required for each ECC symbol because the individual elements of the code word coefficients in $GF(2^t)$ represent t bits of a code word in $GF(2)$. Further, with the ground field $GF(2^t)$, only the first coefficient of a modifying code word is required for the table, not R. Thus the size of each location is reduced.

In our example over $GF(2^6)$, with t=2 and h=3 and j=1, the ground field $GF(2^2)$ has four elements, namely, 00, 01, 10 and 11. These elements are represented, respectively, as:

$$00 = 0$$
$$01 = 1$$
$$10 = \beta$$
$$10 = \beta^2$$

Figure 4:
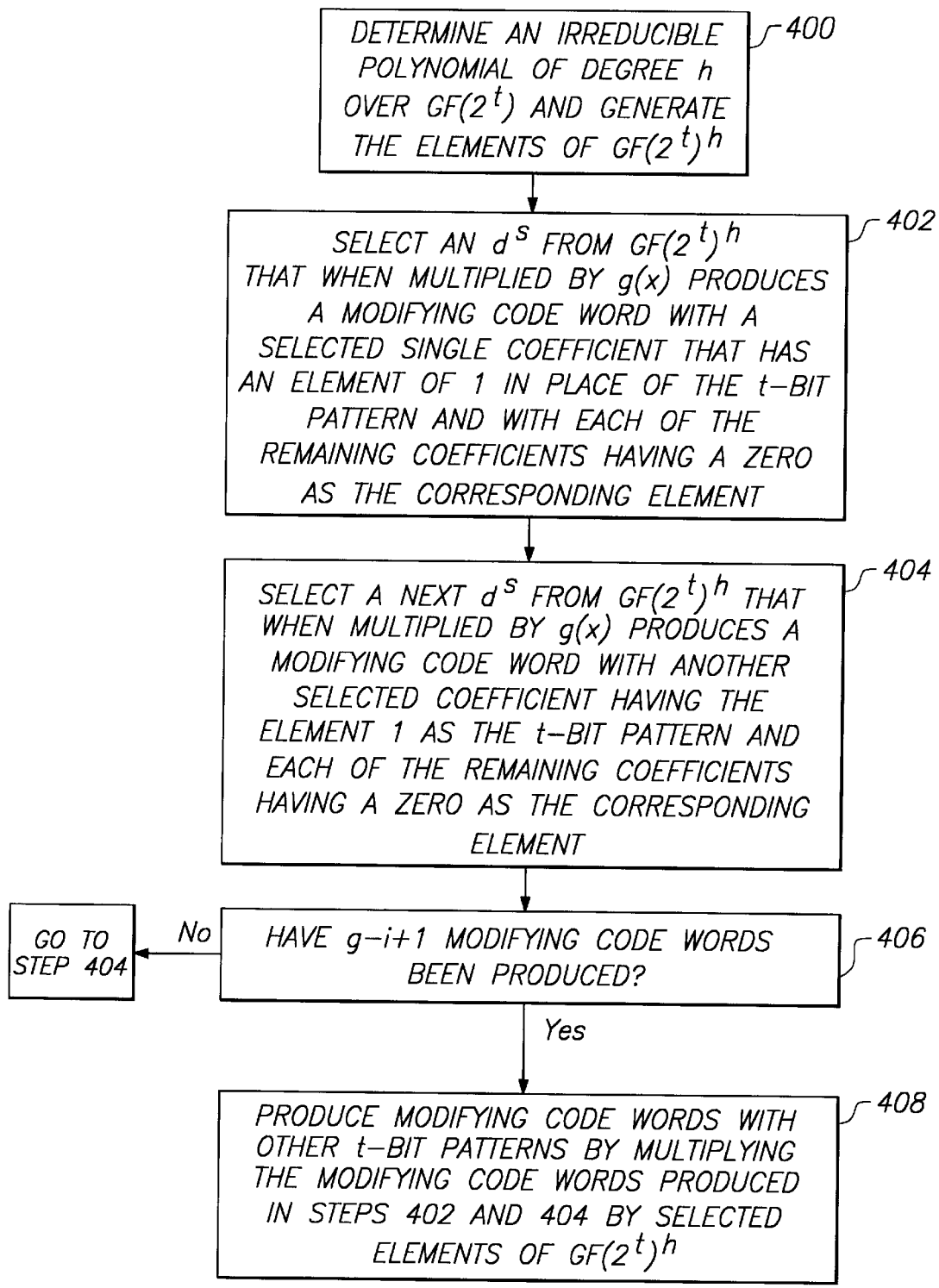
FIG. 4 is a flow chart of alternative operations of the encoder in producing modifying code words of FIG. 1.
Figure 5:
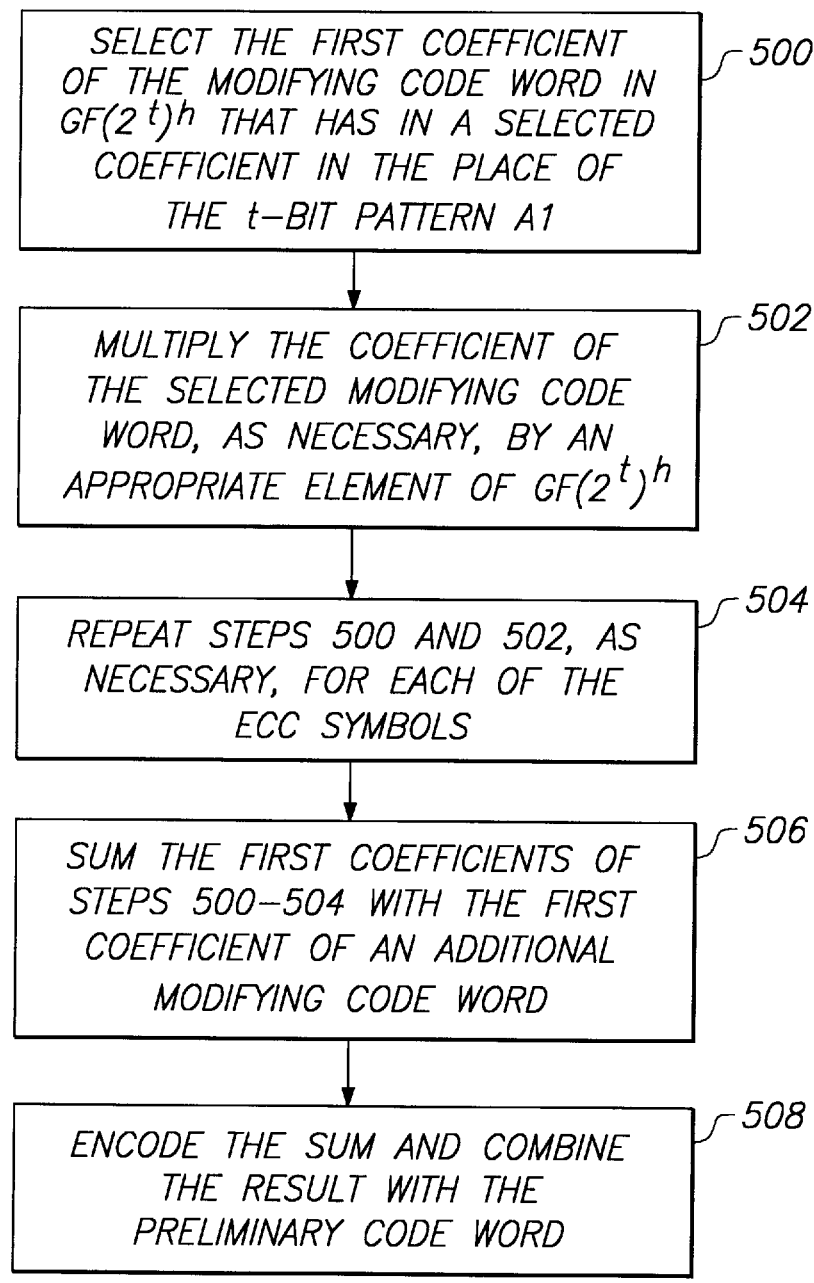
FIG. 5 is a flow chart of further operations of the encoder operating in accordance with FIG. 4.

Referring now to FIG. 4, the system in step 400 uses a generator polynomial of degree t and an irreducible polynomial of degree h over $GF(2^2)$ to generate the elements of the field $GF(2^t)^h$. In the example, a generator polynomial of degree 2 is selected using the search method of section 3 above, and the irreducible degree 3 polynomial $p(x)=x^3+x^2+x+\beta$ is used to generate the elements of $GF(2^2)^3$:

| | | |
|---|---|---|
| $\alpha^0 = 001$ | $\alpha^{22} = 0\beta^0$ | $\alpha^{44} = \beta^2 00$ |
| $\alpha^1 = 010$ | $\alpha^{23} = \beta 00$ | $\alpha^{45} = \beta^2\beta^2 1$ |
| $\alpha^2 = 100$ | $\alpha^{24} = \beta\beta\beta^2$ | $\alpha^{46} = 0\beta 1$ |
| $\alpha^3 = 11\beta$ | $\alpha^{25} = 01\beta^2$ | $\alpha^{47} = \beta 10$ |
| $\alpha^4 = 0\beta^2\beta$ | $\alpha^{26} = 1\beta^2 0$ | $\alpha^{48} = \beta\beta\beta^2$ |
| $\alpha^5 = \beta^2\beta 0$ | $\alpha^{27} = \beta 1\beta$ | $\alpha^{49} = 101$ |
| $\alpha^6 = 1\beta^2 1$ | $\alpha^{28} = \beta^2 0\beta^2$ | $\alpha^{50} = 10\beta$ |
| $\alpha^7 = \beta 0\beta$ | $\alpha^{29} = \beta^2 01$ | $\alpha^{51} = 1\beta^2\beta$ |
| $\alpha^8 = \beta 0\beta^2$ | $\alpha^{30} = \beta^2\beta 1$ | $\alpha^{52} = 10\beta^2$ |
| $\alpha^9 = \beta 1\beta^2$ | $\alpha^{31} = 1\beta 1$ | $\alpha^{53} = 10\beta^2$ |
| $\alpha^{10} = \beta^2 1\beta^2$ | $\alpha^{32} = \beta^2 0\beta$ | $\alpha^{54} = 1\beta\beta$ |
| $\alpha^{11} = \beta^2 01$ | $\alpha^{33} = \beta^2 11$ | $\alpha^{55} = \beta^2\beta^2\beta$ |
| $\alpha^{12} = \beta\beta^2\beta^2$ | $\alpha^{34} = \beta\beta^1$ | $\alpha^{56} = 011$ |
| $\alpha^{13} = 11\beta^2$ | $\alpha^{35} = {}^2\beta^2$ | $\alpha^{57} = 110$ |
| $\alpha^{14} = 0\beta\beta$ | $\alpha^{36} = \beta^2\beta^2 0$ | $\alpha^{58} = 01\beta$ |
| $\alpha^{15} = \beta\beta 0$ | $\alpha^{37} = 0\beta^2 1$ | $\alpha^{59} = 1\beta 0$ |
| $\alpha^{16} = 0\beta\beta^2$ | $\alpha^{38} = \beta^2 10$ | $\alpha^{60} = \beta^2 1\beta$ |
| $\alpha^{17} = \beta\beta^2 0$ | $\alpha^{39} = \beta\beta^2 1$ | $\alpha^{61} = \beta 11$ |
| $\alpha^{18} = 1\beta\beta^2$ | $\alpha^{40} = 1\beta^2\beta^2$ | $\alpha^{62} = \beta^2\beta^2\beta^2$ |
| $\alpha^{19} = \beta^2\beta\beta$ | $\alpha^{41} = \beta\beta\beta$ | |
| $\alpha^{20} = 111$ | $\alpha^{42} = 00\beta^2$ | |
| $\alpha^{21} = 00\beta$ | $\alpha^{43} = 0\beta^2 0$ | |

The system in step 402 then selects an element $\alpha^y$ of $GF(2^t)^h$ that when multiplied by g(x) produces a modifying code word which has a selected coefficient with the element that represents the t-bit pattern set to 1 and the remaining coefficients with corresponding elements set to 0.

If, for example, the two-bit pattern is appended as the leading bits of the $GF(2^6)$ symbols, the system selects first the element of the $GF(2^2)^3$ that when multiplied by g(x) produces a code word with a leading element of 1 in the coefficient of $x^g$, where g is the degree of the generator polynomial, and with the remaining coefficients having, respectively, a 0 as the leading element. The system in steps 404 and 406 next selects the element that when multiplied by g(x) produces a code word with the coefficient of $x^{g-1}$ having as the leading element a 1 and the remaining coefficients having, respectively, a 0 as the leading element, and so forth for $x^{g-t+1}, \ldots x^{g-t+1}$. The code words thus produced correspond to code words in $GF(2^6)$ that have the bit pattern "01" as the top two bits of the coefficients for $x^g$ and $x^{g-1} \ldots x^{g-t+1}$, respectively. If code words that have other patterns are required also to modify the ECC symbols, the system in step 408 multiplies the two modifying code words by the symbols of $GF(2^t)^h$ that have an element $\beta$ and all zeros and an element $\beta_2$ and all zeros, and so forth. In the example over $GF(2^2)^3$, the elements $\alpha^{21}$ and/or $\alpha^{42}$ are used, as appropriate, to produce one or two code words with $\beta$ and/or $\beta^2$ as the leading elements. These code words correspond, respectively, to code words in $GF(2^6)$ with the top two bits set in the patterns "10" and/or "11."

As an example, assume the pattern is selected as the top two bits of the symbols and the generator polynomial is $g(x)=(x+\alpha^2)*(x+\alpha^3)=x^2+\alpha^{58}x+\alpha^5$. The system searches for an $\alpha^v$ that when multiplied by $g(x)$ produces a code word with the desired coefficients. For example, the system selects $\alpha^9$ and produces the modifying code word:

$$\begin{array}{ccc} \beta & 0 & 0 \\ 1 & \beta^2 & \beta \\ \beta^2 & \beta & \beta \\ x^2 & x^1 & x^0 \end{array}$$

This code word has as coefficient of $x^2$ a symbol of $GF(2^2)^3$ that has the leading element $\beta$ and as coefficients of $x^1$ and $x^0$ symbols in $GF(2^2)^3$ with the leading element 0. The coefficient of $x^2$ has in $GF(2^6)$ the pattern "10" as the leading two bits, and the coefficients of $x^1$ and $x^0$ each have in $GF(2^6)$ the pattern "00" as the leading two bits. If a code word with the pattern "01" as the top two bits of the coefficient of $x^2$ is desired, the system multiplies the modifying code word by $\beta^{42}$ to produce the code word:

$$\begin{array}{ccc} 1 & 0 & 0 \\ \beta^2 & \beta & 1 \\ \beta & 1 & 1 \\ x^2 & x^1 & x^0 \end{array}$$

This is the same as multiplying the generator polynomial by $(\alpha^{42}*\alpha^9)=\alpha^{51}$. The system also selects $\alpha^{37}$ and produces the code word:

$$\begin{array}{ccc} 0 & 1 & 0 \\ \beta^2 & 0 & 0 \\ 1 & \beta^2 & \beta^2 \\ x^2 & x^1 & x^0 \end{array}$$

which has the element 1 as the leading element in the coefficient of $x^1$, and 0 as the leading element in each of the coefficients of $x^2$ and $x^0$. This corresponds to a code word in $GF(2^6)$ that has the pattern "01," as the leading two bits of the coefficient of $x^1$ and the leading element 0, or the bit pattern 00 as the top two bits, of the coefficients of $x^2$ and $x^0$. For a code word with a coefficient of $x$ with $\beta$ as the leading element, or in $GF(2^6)$ a pattern of 10, the system multiplies this modifying code word by $\alpha^{21}$.

To modify an ECC symbol, the system in step 500 determines what modifications are necessary to produce the selected pattern, that is, the selected element of $GF(2^2)$, as the leading element of the symbol. The system in step 506 then modifies the symbol by encoding the first coefficient of the modifying code word that contains in the corresponding position the appropriate element of $GF(2^2)$, and combining the result with the preliminary code word. If more than one ECC symbol requires modification, the system adds the first coefficients of the selected modifying code words, and encodes the sum (steps 502, 504).

As an example, the system uses "00" as the two-bit pattern in $GF(2^6)$. If the data symbols encode to the following ECC symbols:

$$\begin{array}{cc} \beta & \beta^2 \\ 1 & \beta \\ \beta^2 & 1 \\ x^1 & x^0 \end{array}$$

the system produces the ECC modifier code word that is combined with the preliminary code word by multiplying by $\beta$ the first coefficient of the modifying code word that has a 1 as the leading element in the coefficient of $x^2$, and multiplying by $\beta^2$ the first coefficient of the modifying code word that has a 1 as the leading element of the coefficient of x. The system then combines the products, adds to the result the leading coefficient of the additional modifying code word s, and encodes the sum. The result is combined with the preliminary code word to produce the data code word.

The system thus produces the sum:

$$\beta \begin{pmatrix} 1 \\ \beta^2 \\ \beta \end{pmatrix} + \beta^2 \begin{pmatrix} 0 \\ \beta^2 \\ 1 \end{pmatrix} = \begin{array}{ccc} \beta & 0 & \beta \\ 1 & \beta & \beta^2 \\ \beta^2 & \beta^2 & 0 \end{array}$$

adds the leading coefficient of the code word S and encodes the sum to produce the code word:

$$\begin{array}{ccc} \beta & \beta^2 & 0 \\ \beta^2 & \beta^2 & \beta \\ 0 & 0 & 0 \\ x^1 & x^0 & x^{-1} \end{array}$$

which the system adds to the preliminary code word. When the elements of $GF(2)$ are substituted for elements of $GF(2^2)$, the result is a data code word in $GF(2^6)$ that includes the data, two ECC symbols with the leading two bits set in the preselected pattern and one pseudo redundancy symbol, with its leading two bits set in the preselected pattern.

The modifying code word table 16 (FIG. 1) thus need contain just the first coefficients of the $j*(d-1)$ code words that have the element 1 as the leading element of the respective powers of x, and from these coefficients it can produce all of the $i*(d-1)$ modifying code words. In the example, the table 16 contains the first coefficients of the two modifying code words and the additional modifying code word S. Thus, the table contains:

| Location of non-zero bit | First coefficient | | |
|---|---|---|---|
| $x^2$ | 1 | $\beta^2$ | $\beta$ |
| $x^1$ | 0 | $\beta^2$ | 1 |

In general, the table for a code $GF(2^a)^b$ that uses $GF(2^a)$ as the ground field has an a-to-1 savings in storage locations over a code $GF(2^{a+b})$ that uses $GF(2)$ as a ground field.

FIG. 7 is a chart of the codes for $GF(2^{12})$, with t=4 or $GF(2^4)^3$ for which the table size is reduced from $4*(d-1)$ code words to $d-1$ information symbols. The modifying tables for these codes contain 1 code word information symbol for each ECC symbol. Conversely, the tables for $GF(2^{8+4})$ contain 4 code words per ECC symbol, or at least the R information symbols of each the $4*(d-1)$ code words. The savings in using $GF(2^4)$ as the ground field is thus at least 4-to-1. FIG. 6 is a chart of the codes over $GF(2^{12})$ for which the code word tables can be minimized. The chart ends at distance 113, but can be extended to include codes over with larger distances.

5. Additional Applications

Referring now to FIG. 7, the encoder 12 may be included in a system in which it communicates with many decoders 100, and sends data that are meant at any given time for a single decoder. If the decoders each use a different i-bit pattern, the encoder selects from an internal register 13 the i-bit pattern that is used by the selected single decoder and uses that pattern to encode the data into data code words as described above. When the decoders decode the data code words, only the decoder that uses the same i-bit pattern will determine that the code words are either error-free or correctable. The other decoders will decode the code word and determine that every symbol, or nearly every symbol, is in error because of the differences in the i-bit patterns.

Figure 8:
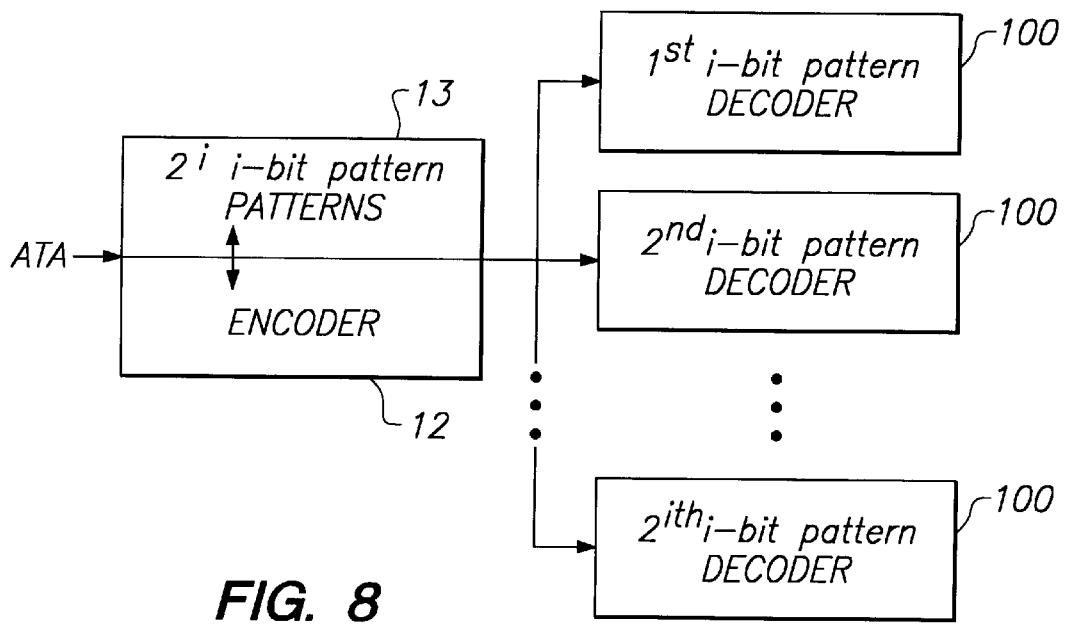
FIG. 8 is a functional block diagram of an additional system that includes the encoder of FIG. 1.
Figure 9:
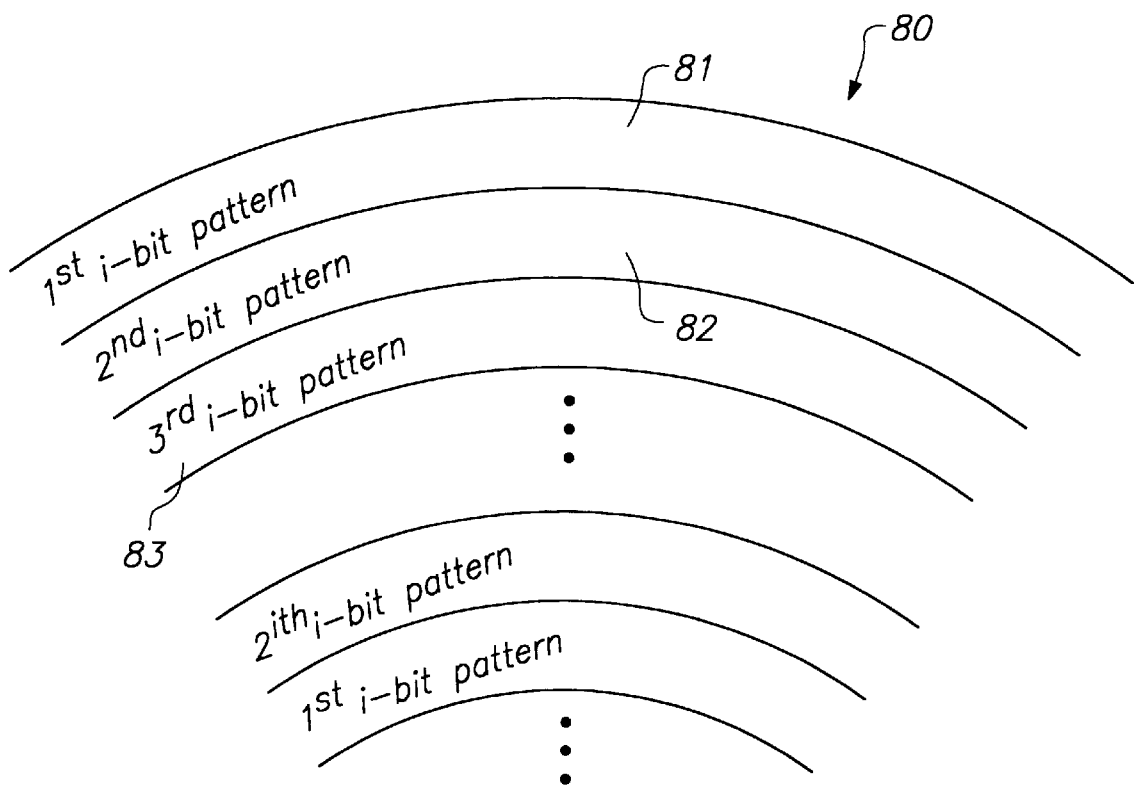
FIG. 9 is an illustration of a disk that is included in a system that uses the encoder of FIG. 1.

FIG. 8 depicts a disk 80 in which adjacent tracks 82, 83 . . . are associated with different i-bit patterns. Specifically, the data code words that are stored in a given track are encoded using the associated i-bit pattern. If the system later intends to retrieve a data code word from track 82 and instead retrieves the code word from track 83 the system will determine that all or nearly all of the symbols in the retrieved code word are erroneous. Accordingly, the system will not mistakenly interpret the retrieved data code word as the code word it intended to retrieve.

The foregoing description has been limited to a specific embodiment of this invention. It will be apparent, however, that variations and modifications may be made to the invention, with the attainment of some or all of its advantages. Therefore, it is the object of the appended claims to cover all such variations and modifications as come within the true spirit and scope of the invention.

What is claimed is:

1. A method for encoding data symbols into code words using a distance d modified Reed-Solomon error correction code ("ECC") over Galois Field ($p^{m+i}$) to produce a code word in GF($p^m$), the method including the steps of:

A. encoding k–R data symbols to produce d–1 (m+i)-bit ECC symbols and forming a preliminary code word;

B. ascertaining which, if any, of the i selected bits in each of the ECC symbols match a predetermined i-bit truncation pattern, and C.(i) in response to a determination that the selected i bits in each of the ECC symbols match the pattern, forming a data code word by combining the preliminary code word with an additional modifying code word, s, that has R symbols with the I bits set in the i-bit pattern and d–1 symbols with the i bits set to all zeros, to append to the preliminary code word R pseudo redundancy symbols that each have the i-bit predetermined pattern and m all zero bits, (ii) in response to a determination that the selected i bits in at least one of the ECC symbols do not match the pattern, modifying the ECC symbols by combining the symbols with an ECC modifier code word that includes d–1 ECC modifying symbols and R pseudo redundancy symbols, the combination producing a data code word with k–R data symbols, d–1 modified ECC symbols and R pseudo redundancy symbols, all of which have the selected i bits set in the predetermined pattern, and (iii) truncating the i bits from the data code word symbols.

2. The encoding method as recited in claim 1 wherein the modifying step further includes:

a. selecting one or more modifying code words for each ECC symbol in response to the location of each one of the selected i bits in the symbol that does not match the corresponding bit in the predetermined i-bit pattern;

b. combining the modifying code words and an additional modifying code word to produce the ECC modifier code word.

3. The method recited in claim 1 wherein the modifying step further includes:

a. selecting R leading coefficients of one or more modifying code words for each ECC symbol, in response to the location of each one of the selected i bits of the symbol that does not match the corresponding bit in the predetermined i-bit pattern;

b. combining R leading coefficients of the modifying code words with R leading coefficients of the additional modifying code word to produce R code word information symbols; and c. encoding the R information symbols to produce an ECC modifier code word that includes d–1 ECC symbol modifiers and R pseudo redundancy symbols.

4. A method for selecting a code for use in a modified Reed Solomon encoder that encodes using an error correction code over GF($p^{m+i}$) to produce a code word with symbols in GF($p^m$), the method including the steps of:

A. selecting a distance d and setting L, the lowest root, equal to zero;

B. using a generator polynomial $$g(x)=(x+\alpha^L)*(x+\alpha^{L+1})* \ldots (x+\alpha^{L+n-k-1})=x^{n-k}+g_{n-k-1}x^{n-k-1}+\ldots +g_1x^1+g_0x^0$$

produce a code word $c_1'(x)=g'_{n-k}x^{n-k}+g'_{n-k-1}x^{n-k-1}+\ldots +g'x+1x^0$ where $$g'_i = \frac{g_i}{g_0};$$

C. cyclically shifting the code word $c_1'(x)$ to produce a code word $c_1(x)$ that has as a 1 as the coefficient of $x^{-1}$;

D. multiplying $c_1(x)$ by $\alpha^0, \alpha^1 \ldots \alpha^{m-1}$ to produce base code words $b_0, b_1, \ldots b_{m-1}$;

E. cyclically shifting $c_1(x)$;

F. multiplying $c_1(x)$ by the coefficient of $x^0$ of $c_1(x)$;

G. adding the results of steps D and E to produce a code word $c_2(x)$;

H. multiplying $c_2(x)$ by $\alpha^0, \alpha^1 \ldots \alpha_{m-1}$ to produce base code words $b_m, b_{m+1} \ldots b_{2m-1}$ I. cyclically shifting $c_2(x)$;

J. multiplying $c_1(x)$ by the coefficient of $x^0$ of $c_2(x)$;

K. adding the results of steps H and I to produce a code word $C_3(x)$;

L. multiplying $c_3(x)$ by $\alpha^0, \alpha^1 \ldots \alpha^{m-1}$ to produce base code words $b_{2m}, b_{2m+1} \ldots b_{3m-1}$;

M. repeating steps H–K for all $c_w(x)$, $3 \leq w \leq i*m$;

N. determining if $i*(d-1)$ modifying code words can be produced from linear combinations of the base words $b_0, b_1, \ldots b_{(m*w)-1}$ O. if so, selecting g(x) as the generator polynomial;

P. if not setting L=L+1 and if $L \leq p^{m+i}-1$ repeating steps B–N.

5. A method for determining modifying code words for use in a modified Reed Solomon encoder that uses an error correction code over GF($2^r)^{h+j}$ to produce a code word with symbols in GF($2^r)^h$, the method including the steps of:

19

A. determining an irreducible polynomial of degree h over $GF(2^r)$;

B. selecting an $\alpha^v$ from $GF(2^r)^h$ that when multiplied by g(x) produces a code word with one coefficient having an element of one in a predetermined position and the other of the coefficients having 0 as the corresponding element;

C. selecting another $\alpha^v$ to produce another code word with a different coefficient having an element of one in a predetermined position and other coefficients having 0 as the corresponding element;

D. repeating step C to produce a total of j*(d−1) code words;

E. multiplying the code words produced in steps B–D by selected elements of $GF(2^r)^h$ to produce additional code words that have a selected element of $GF(2^r)^h$ in the predetermined position.

6. A system for sending data from one encoder to a selected one of many decoders, each of which uses a modified Reed Solomon code that is associated with a preselected i-bit pattern, the system including:

A. an encoder that encodes data over $GF(p^{m+i})$ and produces data code words in $GF(p^m)$ using a modified Reed Solomon Code and one of many preselected i-bit truncation patterns, the encoder encoding data intended for a particular one of the decoders using the i-bit pattern associated with the particular decoder; and B. a plurality of decoders, each of the decoders decoding the data code word using the i-bit pattern that is associated with the decoder, the decoders using patterns that differ from the pattern used to encode the data decoding the data code word to uncorrectable data and the decoder using the same pattern that is used to encode the data decoding the data code word to error-free or correctable data.

7. A system of claim 6, wherein each decoder includes:

a. means for encoding up to k–R data symbols to produce d−1 (m+i)-bit ECC symbols and forming a preliminary code word;

b. means for ascertaining which, if any, of the i selected bits in each of the ECC symbols match a predetermined i-bit truncation pattern, and c. means for (i) in response to a determination that the selected i bits in each of the ECC symbols match the pattern, forming a data code word by combining the preliminary code word with an additional modifying code word S, that has R symbols with the i bits set in the i-bit pattern used by the decoder and d−1 symbols with the i bits set to all zeros, to append to the preliminary code word R pseudo redundancy symbols that each have the i-bit predetermined pattern, (ii) in response to a determination that the selected i bits in at least one of the ECC symbols do not match the pattern, modifying the ECC symbols by combining the symbols with an ECC modifier code word that includes d−1 ECC modifying symbols and R pseudo redundancy symbols, the combination producing a data code word with k–R data symbols, d−1 modified ECC symbols and R pseudo redundancy symbols, all of which have the selected i bits set in the predetermined pattern.

8. The encoding system of claim 7 wherein each of the decoders further includes:

a. means for selecting one or more modifying code words for each ECC symbol in response to the location of each one of the selected i bits in the symbol that does not match the corresponding bit in the predetermined i-bit pattern;

b. means for combining the modifying code words and the additional modifying code word to produce the ECC modifier code word.

9. The system of claim 7 wherein the encoder further includes:

a. means for selecting the R leading coefficients of one or more modifying code words for each ECC symbol, in response to the location of each one of the selected i bits of the symbol that does not match the corresponding bit in the predetermined i-bit pattern;

c. means for combining the R leading coefficients of the modifying code words and R leading coefficients of the additional modifying code word to produce R information symbols d. means for encoding the R information symbols to produce the ECC modifier code word.

10. A system for storing data to and retrieving data from a disk, the system including:

A. an encoder for encoding data over $GF(2^{m+i})$ and producing data code words over $GF(2^m)$, the encoder using one of many preselected i-bit truncation patterns and encoding data to be stored in a particular track on the disk using the i-bit pattern associated with the particular track; and B. means for retrieving data from a track on the disk; and C. a decoder for decoding the retrieved data code word using the i-bit pattern associated with the track from which the data code word was intended to be retrieved, the decoder decoding the data code word to uncorrectable data if the means for retrieving the data retrieves the data from the incorrect track and decoding the data code word to error-free or correctable data if the data code word was retrieved from the correct track.

11. A system of claim 10, wherein the encoder includes:

a. means for encoding up to k–R data symbols to produce d−1 (m+i)-bit ECC symbols and forming a preliminary code word;

b. means for ascertaining whether i selected bits in each of the ECC symbols match a predetermined i-bit truncation pattern, and c. means for (i) in response to a determination that the selected i bits in each of the ECC symbols match the pattern, forming a data code word by combining the preliminary code word with an additional modifying code word that has R symbols with the bits set in the i-bit pattern associated with the track and d−1 symbols with the i bits set to all zeros, to append to the preliminary code word R pseudo redundancy symbols that each have the i-bit predetermined pattern;

(ii) in response to a determination that the selected i bits in at least one of the ECC symbols do not match the pattern, modifying the ECC symbols by combining the symbols with an ECC modifier code word that includes d−1 ECC modifying symbols and R pseudo redundancy symbols, the combination producing a data code word with k–R data symbols, d−1 modified ECC symbols and R pseudo redundancy symbols, all of which have the selected i bits set in the predetermined pattern.

12. The encoding system of claim 11 wherein the encoder further includes:

a. means for selecting one or more modifying code words for each ECC symbol in response to the location of each one of the selected i bits in the symbol that does not match the corresponding bit in the selected i-bit pattern;

b. means for selecting an additional modifying code word that has particular symbols with the i bits set in the selected pattern;

c. means for combining the modifying code words and the additional modifying code word to produce an ECC modifier code word that includes d−1 ECC symbol modifiers and the R pseudo redundancy symbols; and d. means for modifying the ECC symbols in the preliminary code word by combining the preliminary code word and the ECC modifier code word.

13. The system of claim 11 wherein the encoder further includes:

a. means for selecting the R leading coefficients of one or more modifying code words for each ECC symbol, in response to the location of each one of the i bits of the symbol that does not match the corresponding bit in the selected i-bit pattern;

b. means for selecting the R leading coefficient of an additional modifying code word that has particular symbols with the i bits set in the selected pattern;

c. means for combining the R leading coefficients of the modifying code words and the additional modifying code word to R information symbols;

d. means for encoding the R information symbols to produce the ECC modifier code word.

14. A method of reducing the modifying code word storage requirements of a system that encodes data over $GF(2^{m+i})$ to produce code words in $GF(2^m)$ using a modified Reed Solomon code, the method including the steps of:

A. determining a ground field $GF(2^r)$ where $GF(2^m)=GF(2^r)^h$ and $GF(2^{m+i})=GF(2^r)^{h+j}$ and a generator polynomial g(x) of degree t;

B. determining an irreducible polynomial of degree h over $GF(2^r)$;

C. determining t−i+1 modifying code words in $GF(2^r)^h$ that each have, respectively, an element 1 of $GF(2^r)$ 1 in a selected position;

D. storing the first coefficient of each of the modifying code words in locations associated, respectively, with the position of a non-zero element in the symbols of $GF(2^r)^h$.

* * * * *